United States Patent
Hong et al.

(10) Patent No.: US 11,315,835 B2
(45) Date of Patent: Apr. 26, 2022

(54) METHODS OF FORMING AN IC PRODUCT COMPRISING TRANSISTOR DEVICES WITH DIFFERENT THRESHOLD VOLTAGE LEVELS

(71) Applicant: GLOBALFOUNDRIES U.S. Inc., Santa Clara, CA (US)

(72) Inventors: Wei Hong, Clifton Park, NY (US); Hong Yu, Clifton Park, NY (US); Tao Chu, Clifton Park, NY (US); Bingwu Liu, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 109 days.

(21) Appl. No.: 16/296,469

(22) Filed: Mar. 8, 2019

(65) Prior Publication Data

US 2020/0286790 A1    Sep. 10, 2020

(51) Int. Cl.
*H01L 29/78*         (2006.01)
*H01L 29/66*         (2006.01)
*H01L 21/8234*       (2006.01)
*H01L 29/06*         (2006.01)
*H01L 21/308*        (2006.01)

(52) U.S. Cl.
CPC .. *H01L 21/823462* (2013.01); *H01L 21/3086* (2013.01); *H01L 21/823431* (2013.01); *H01L 21/823437* (2013.01); *H01L 21/823481* (2013.01); *H01L 29/0649* (2013.01); *H01L 29/66545* (2013.01); *H01L 29/66795* (2013.01); *H01L 29/7851* (2013.01)

(58) Field of Classification Search
None
See application file for complete search history.

(56) References Cited

U.S. PATENT DOCUMENTS

| | | |
|---|---|---|
| 8,367,558 B2 | 2/2013 | Xu et al. |
| 8,669,615 B1 | 3/2014 | Chang et al. |
| 2015/0287725 A1 | 10/2015 | Zang |
| 2016/0163603 A1 | 6/2016 | Bao et al. |
| 2018/0350955 A1* | 12/2018 | Chen ................ H01L 29/4958 |
| 2020/0118888 A1* | 4/2020 | Bao ................ H01L 21/823821 |

OTHER PUBLICATIONS

Jones, "IEDM 2017—Controlling Threshold Voltage with Work Function Metals," published on Jan. 26, 2018.
Erben et al., "Work Function Setting in HIgh-k Metal Gate Devices," IntechOpen, 2018.

* cited by examiner

*Primary Examiner* — Grant S Withers
(74) *Attorney, Agent, or Firm* — Francois Pagette; Hoffman Warnick LLC

(57) ABSTRACT

One illustrative method disclosed herein includes forming a conformal SMCM layer above a conformal high-k gate insulation layer within each of first and second replacement gate cavities (RGC), removing the SMCM layer from the first RGC while leaving the SMCM layer in position within the second RGC, forming a first conformal metal-containing material (MCM) layer above the gate insulation layer within the first RGC and above the SMCM layer in position within the second RGC, removing the first conformal MCM layer and the conformal SMCM layer positioned within the second RGC while leaving the first conformal MCM layer within the first RGC, and forming a second conformal MCM layer above the first conformal MCM layer positioned within the first RGC and above the gate insulation layer positioned within the second RGC.

20 Claims, 20 Drawing Sheets

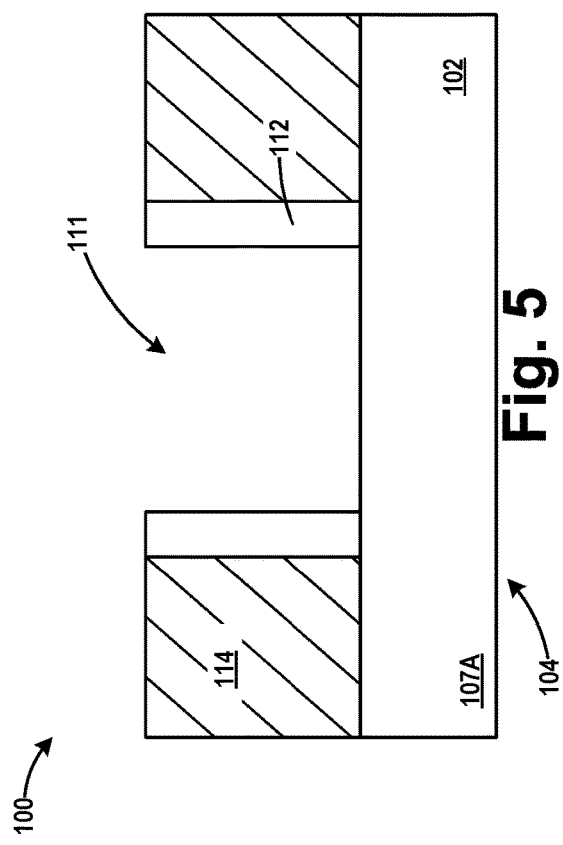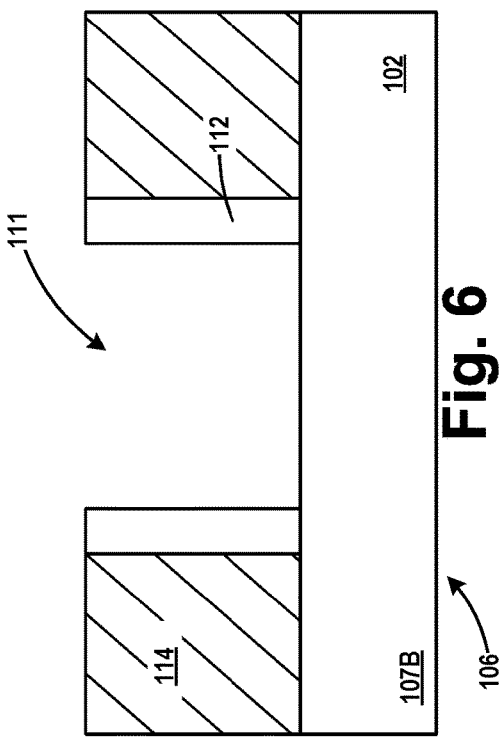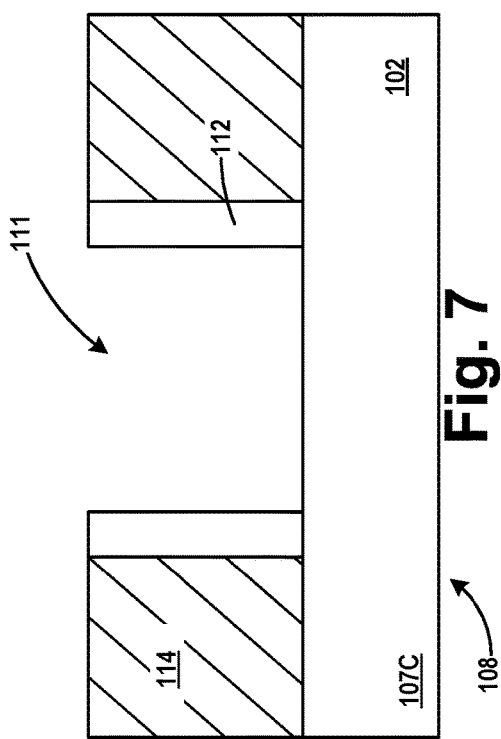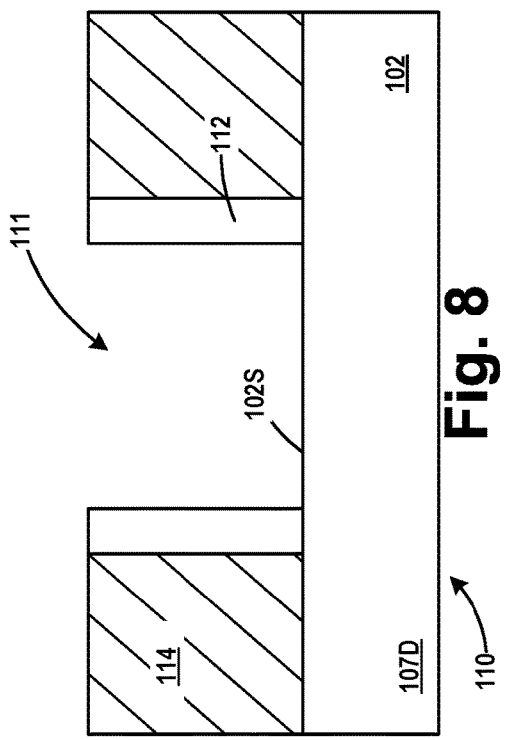

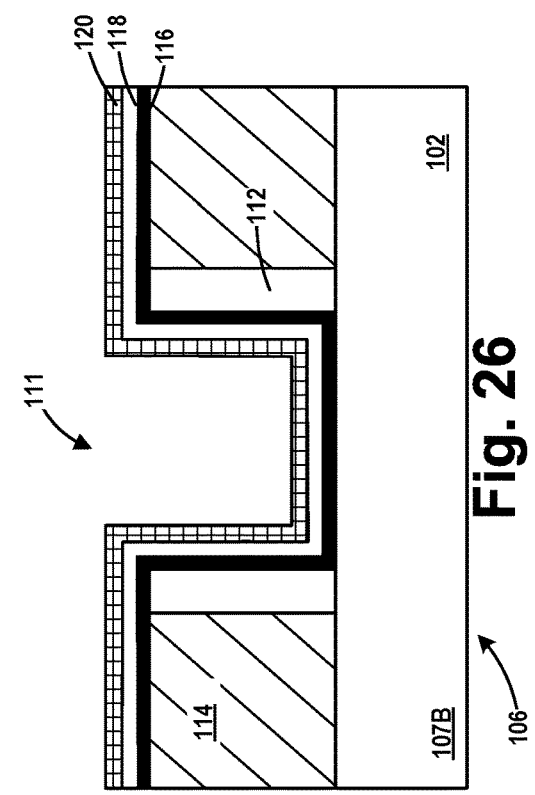
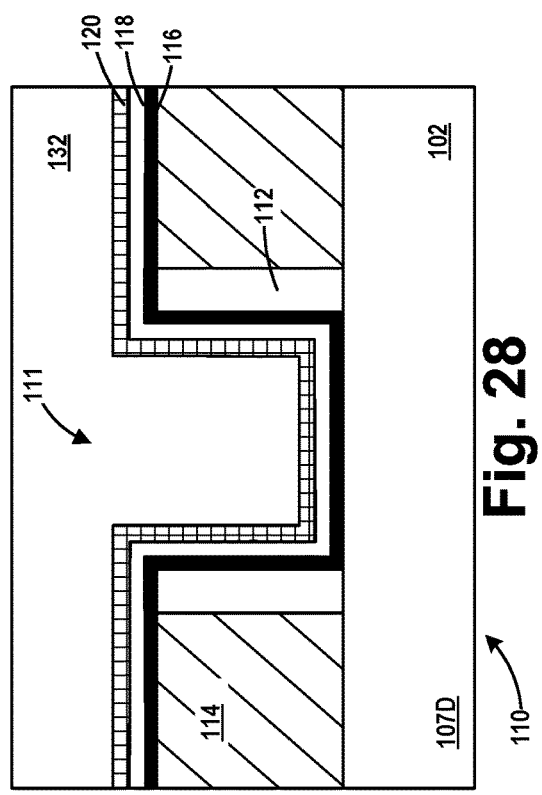
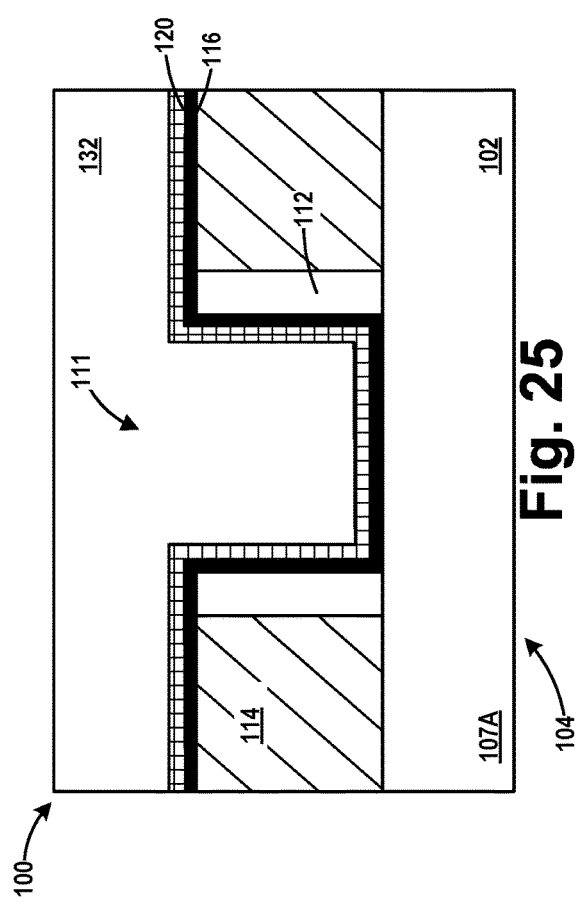
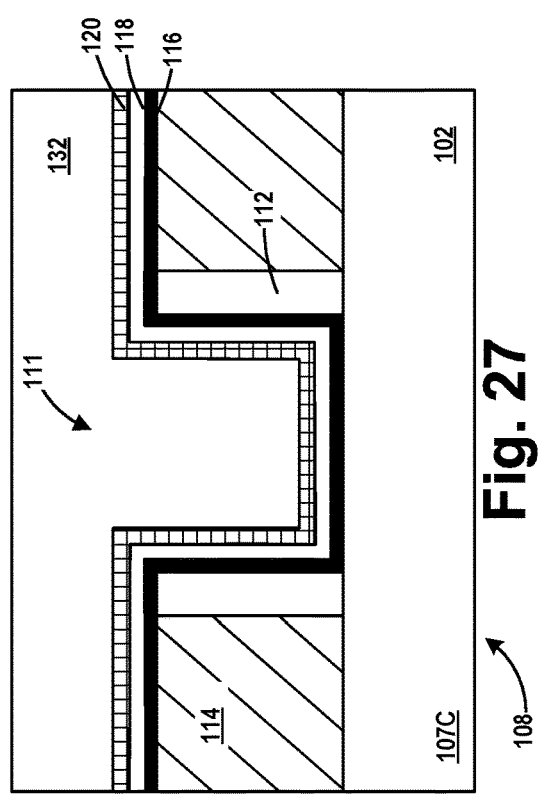

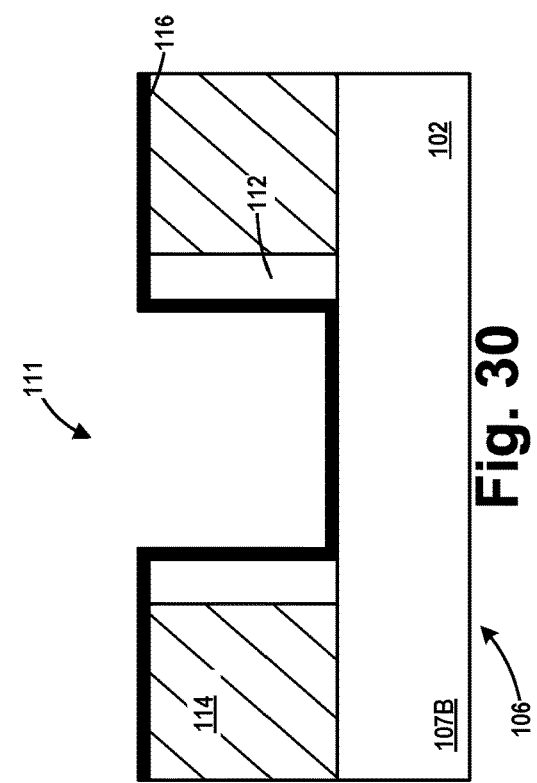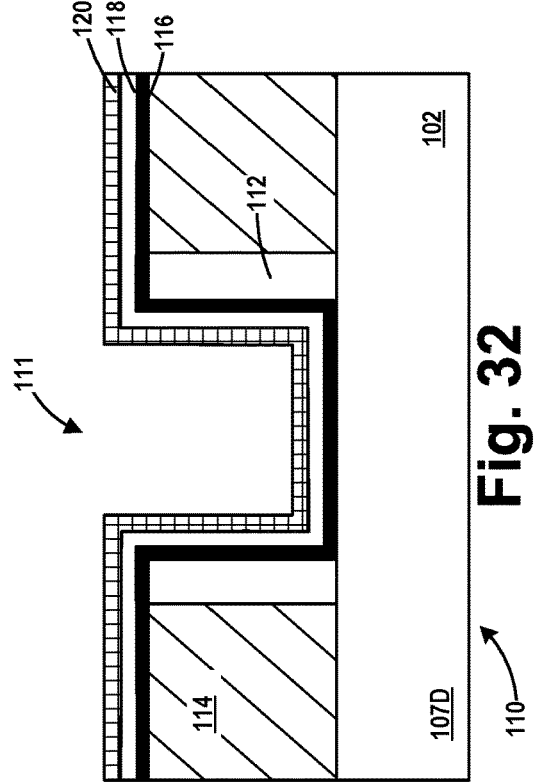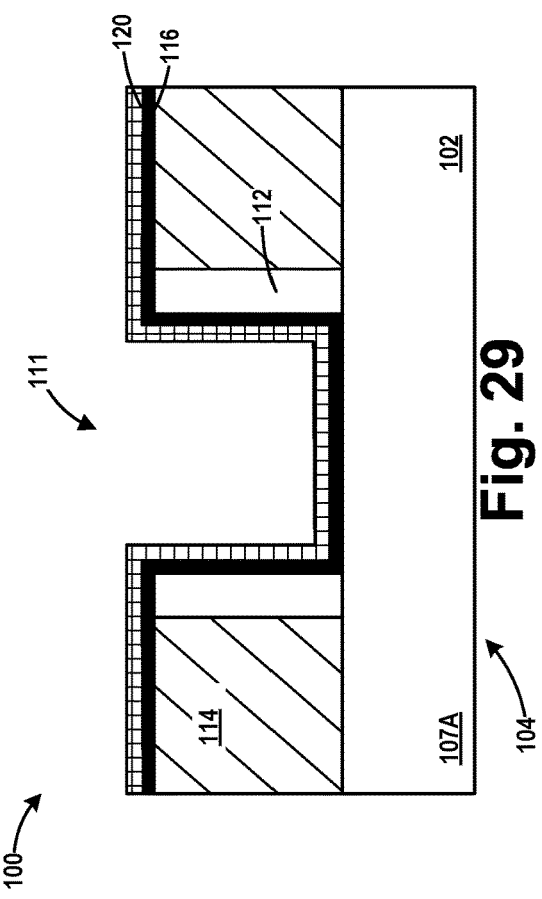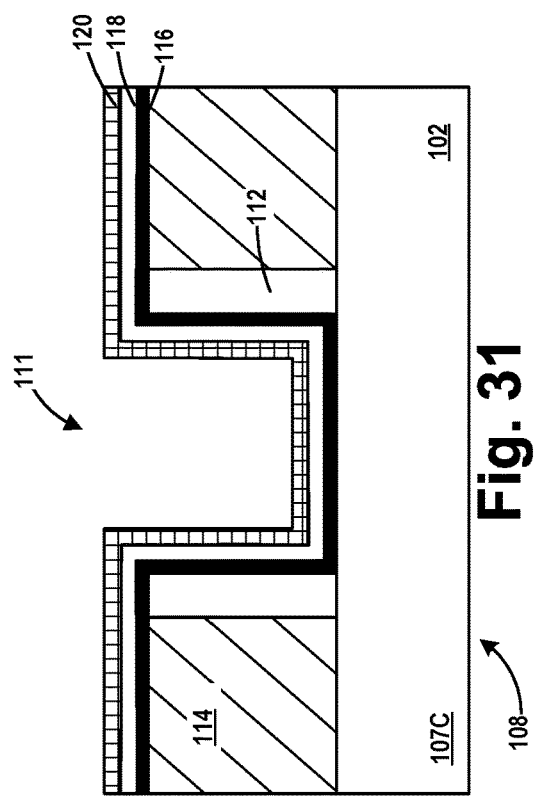

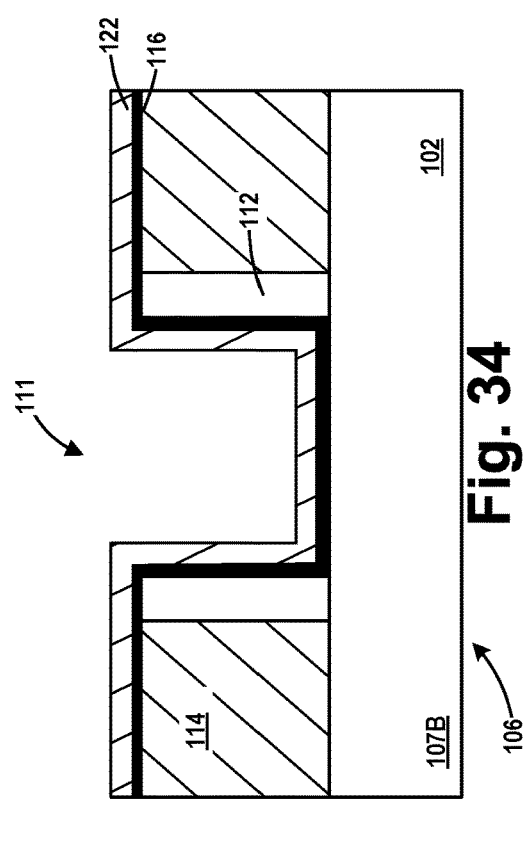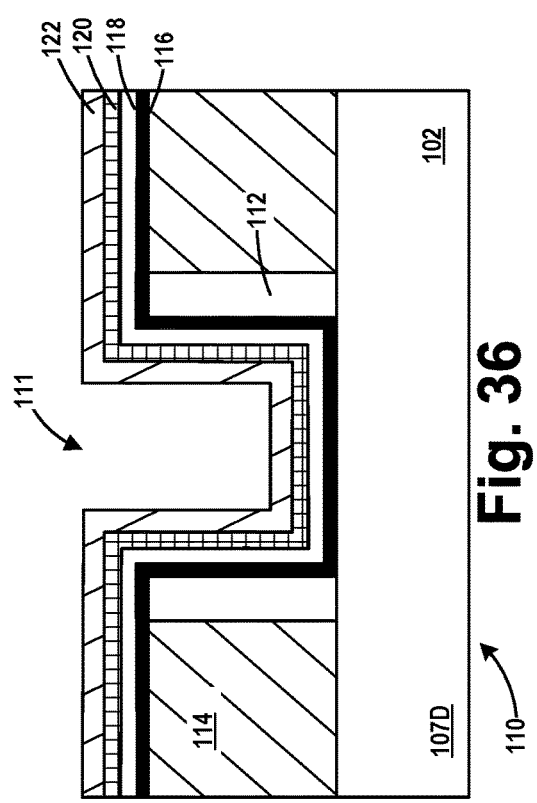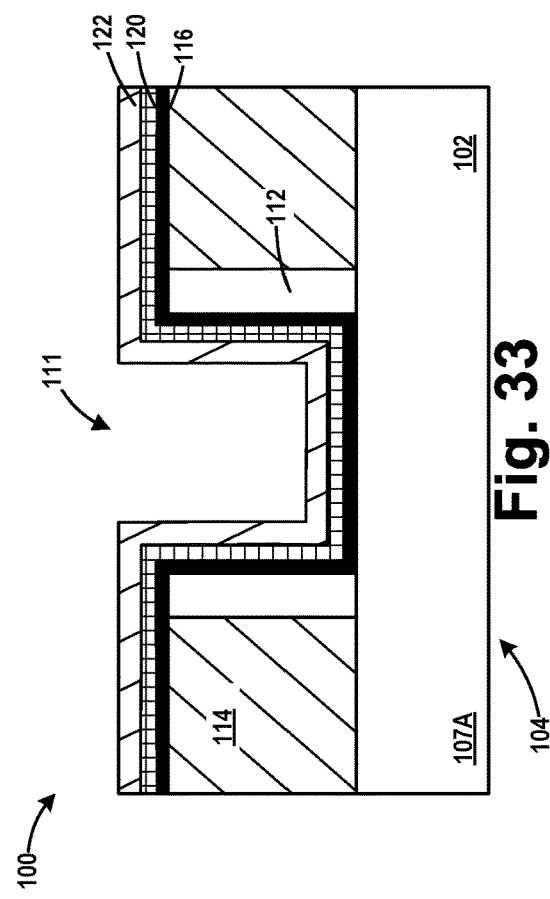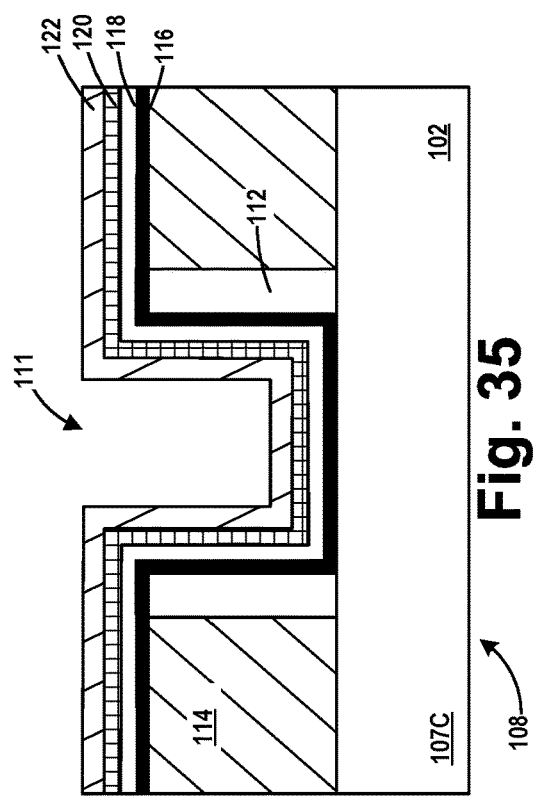

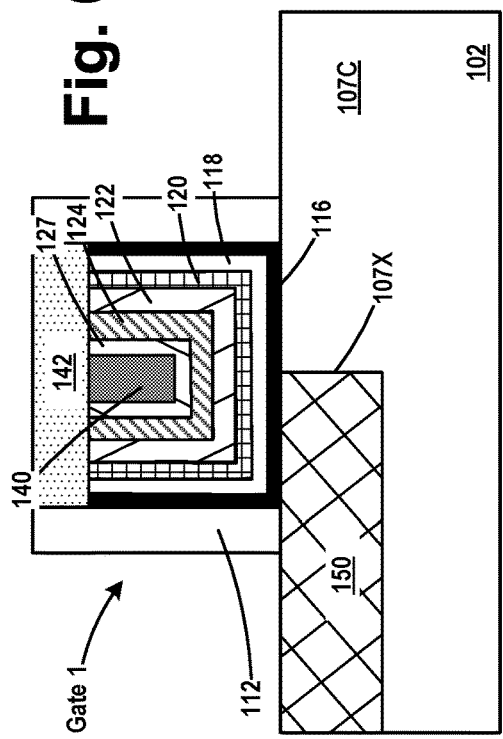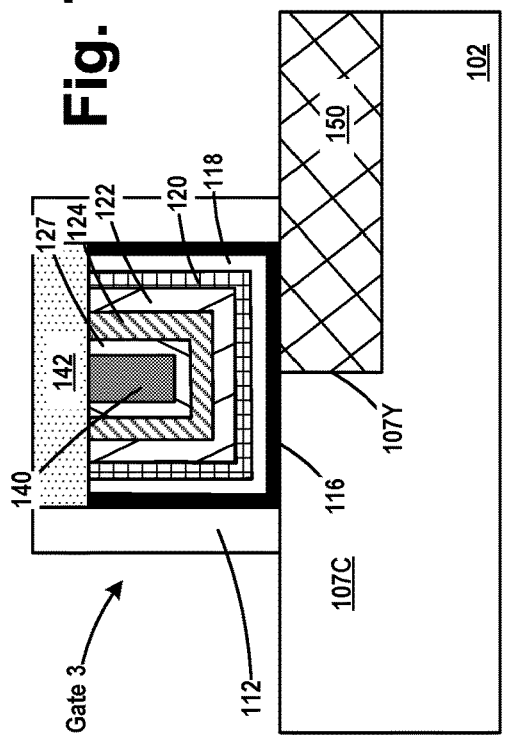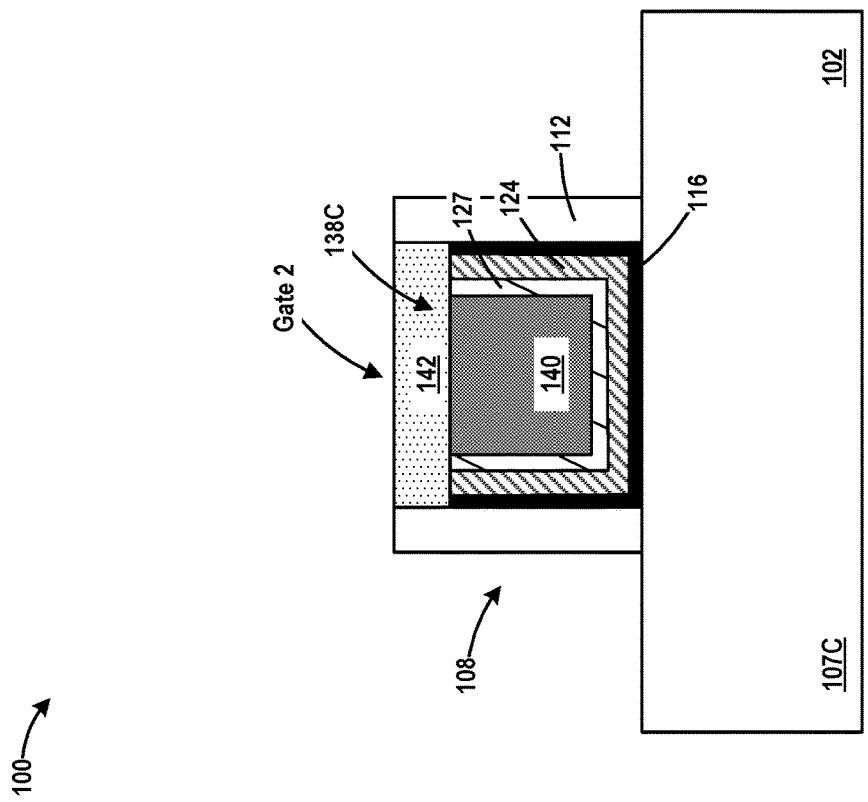

METHODS OF FORMING AN IC PRODUCT COMPRISING TRANSISTOR DEVICES WITH DIFFERENT THRESHOLD VOLTAGE LEVELS

BACKGROUND

Generally, the present disclosure relates to the manufacture of semiconductor devices, and, more specifically, to various novel methods of forming an integrated circuit (IC) product comprising transistor devices with different threshold voltage levels.

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices.

The threshold voltage (Vt) of a transistor is the voltage that is required to turn the transistor "ON." In general, transistor devices with relatively lower threshold voltage levels will exhibit relatively faster performance, e.g., faster ON-OFF switching speed, and relatively greater off-state leakage currents, which may lead to greater power consumption. Conversely, transistor devices with relatively higher threshold voltage levels will exhibit relatively slower performance, e.g., slower ON-OFF switching speed, but relatively lower off-state leakage currents, which may result in reduced power consumption. Thus, IC products may be formed with transistors having different threshold voltages in an effort to optimize the power and performance of IC products. This optimization has become increasingly important for mobile devices wherein it is desired to have high performance and low power consumption so as to increase battery life. The number of different threshold voltage classes available for use on an IC product has proliferated so as to assist product designers to meet these objectives. These different classes of transistor devices may be categorized as, for example, low threshold voltage (LVT) devices, regular threshold voltage (RVT) devices or high threshold voltage (HVT) devices, etc. Where once it was typical to design an IC product using one or two different classes of threshold voltage transistors, more recent products may include four or even five different classes of threshold voltages. Multiple threshold voltage devices allow designers to select the best option for each section of a design trading-off power and performance.

The present disclosure is directed to various novel methods of forming an integrated circuit (IC) product comprising transistor devices with different threshold voltage levels.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

Generally, the present disclosure is directed to various novel methods of forming an integrated circuit (IC) product comprising transistor devices with different threshold voltage levels. One illustrative method disclosed herein includes forming a conformal high-k gate insulation layer within first and second replacement gate cavities for first and second transistors, respectively, forming a conformal sacrificial metal-containing material (SMCM) layer above the conformal high-k gate insulation layer within each of the first and second replacement gate cavities, and removing the conformal SMCM layer positioned within the first replacement gate cavity while leaving the conformal SMCM layer in position within the second replacement gate cavity. In this example, the method also includes forming a first conformal metal-containing material (MCM) layer above the conformal high-k gate insulation layer within the first replacement gate cavity and above the conformal SMCM layer in position within the second replacement gate cavity, removing the first conformal MCM layer and the conformal SMCM layer positioned within the second replacement gate cavity while leaving the first conformal MCM layer within the first replacement gate cavity, and forming a second conformal metal-containing material (MCM) layer above the first conformal MCM layer positioned within the first replacement gate cavity and above the conformal high-k gate insulation layer positioned within the second replacement gate cavity.

One illustrative IC product disclosed herein includes first and second isolated active regions formed in a semiconductor substrate, an isolation material positioned between the first and second active regions and a shared gate structure. In this example, the shared gate structure includes a first portion that is positioned above the first active region, a second portion that is positioned above the second active region and a third portion that is positioned above the isolation material positioned between the first and second active regions. The first, second and third portions of the shared gate structure include a conformal high-k gate insulation layer. The third portion of the shared gate structure includes a unique conformal layer of material positioned on and in contact with the conformal high-k gate insulation layer, but the unique conformal layer of material is not present in either of the first or second portions of the shared gate structure.

BRIEF DESCRIPTION OF THE DRAWINGS

The disclosure may be understood by reference to the following description taken in conjunction with the accompanying drawings, in which like reference numerals identify like elements, and in which:

FIGS. 1-70 depict various illustrative novel methods disclosed herein for forming an integrated circuit (IC) product comprising transistor devices with different threshold voltage levels.

Figure 1:
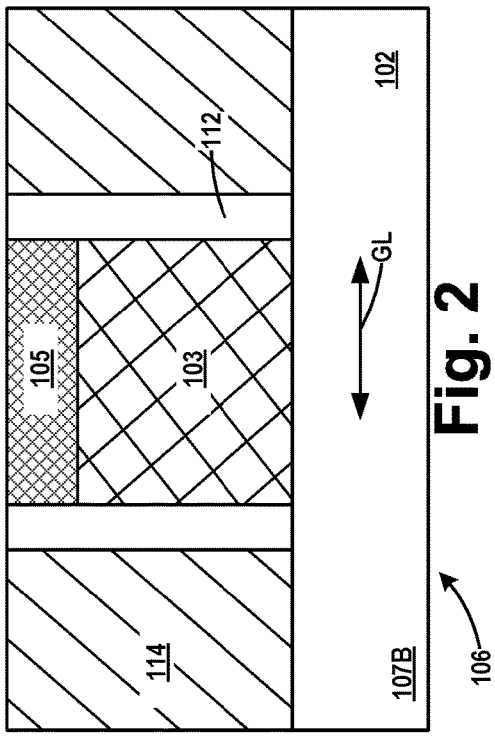
Figure 2:
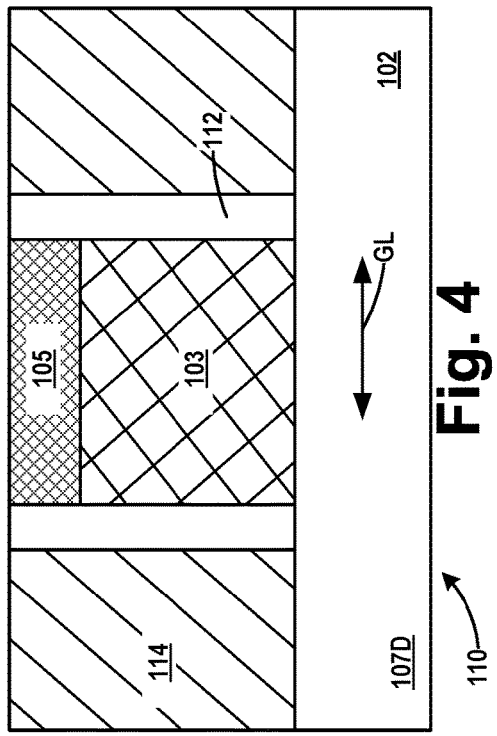
Figure 3:
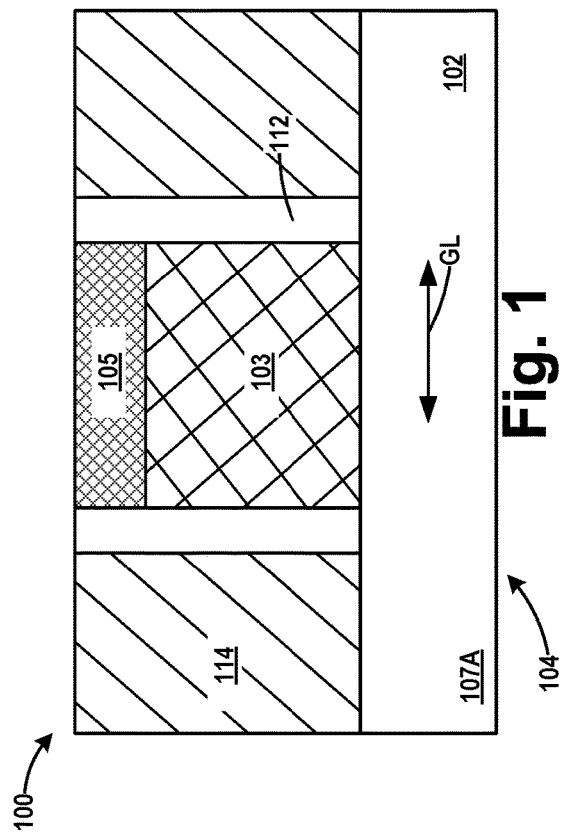
Figure 4:
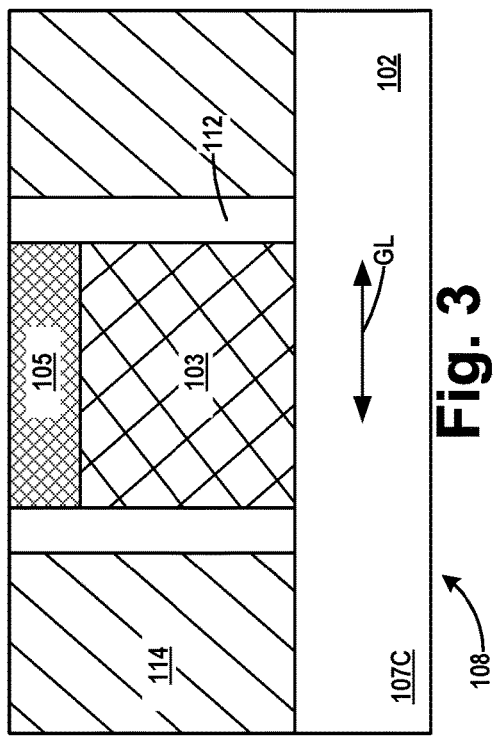
Figure 9:
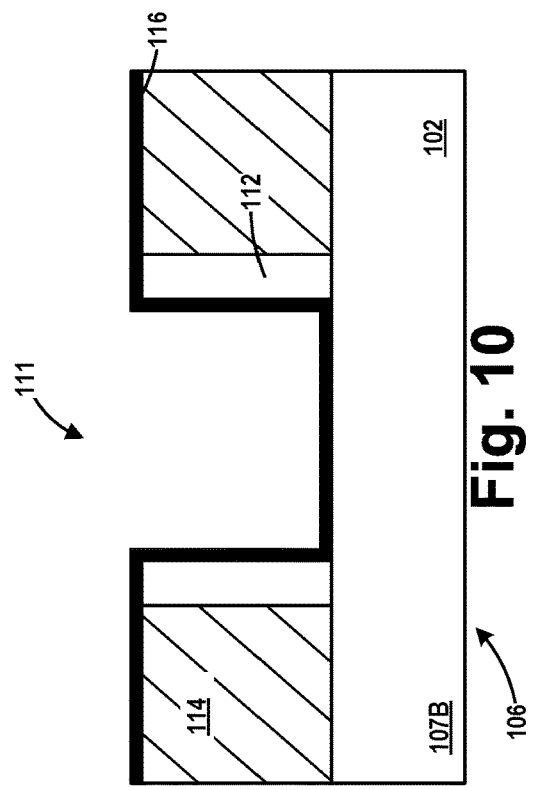
Figure 10:
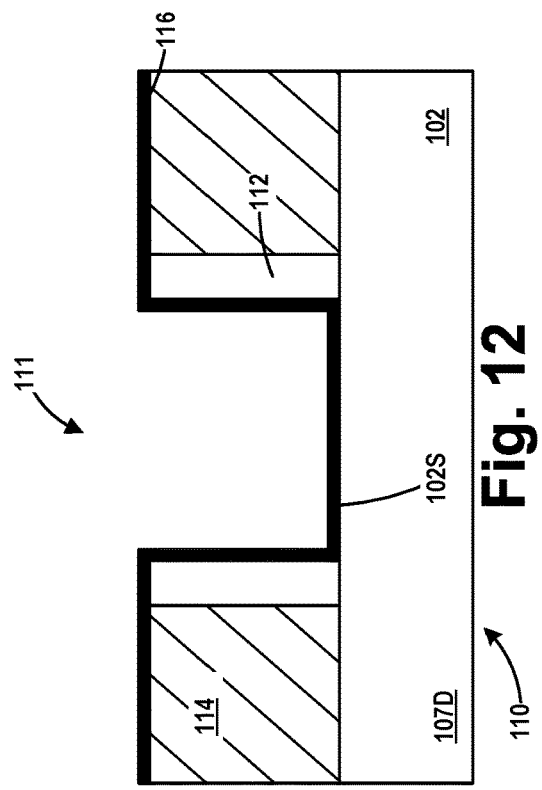
Figure 11:
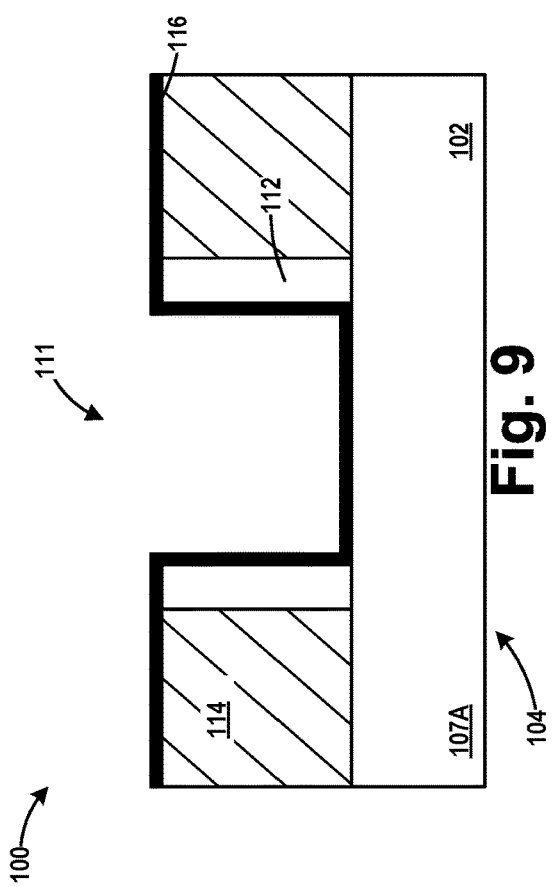
Figure 12:
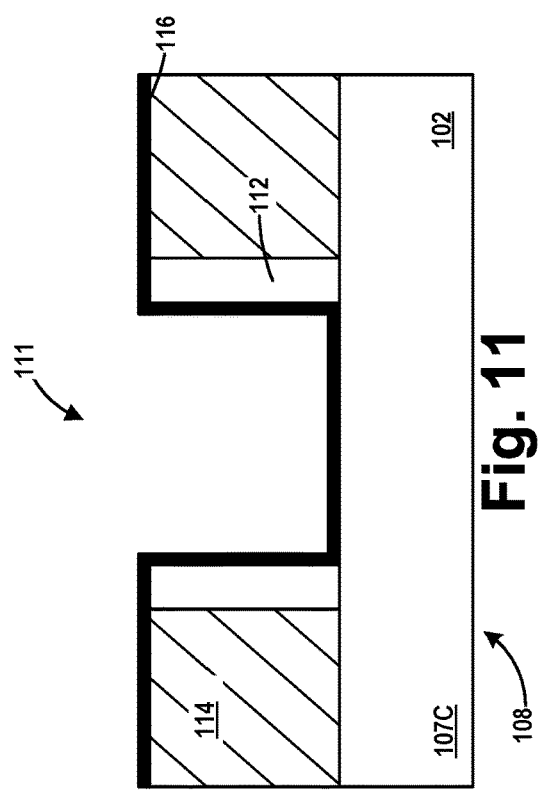
Figure 13:
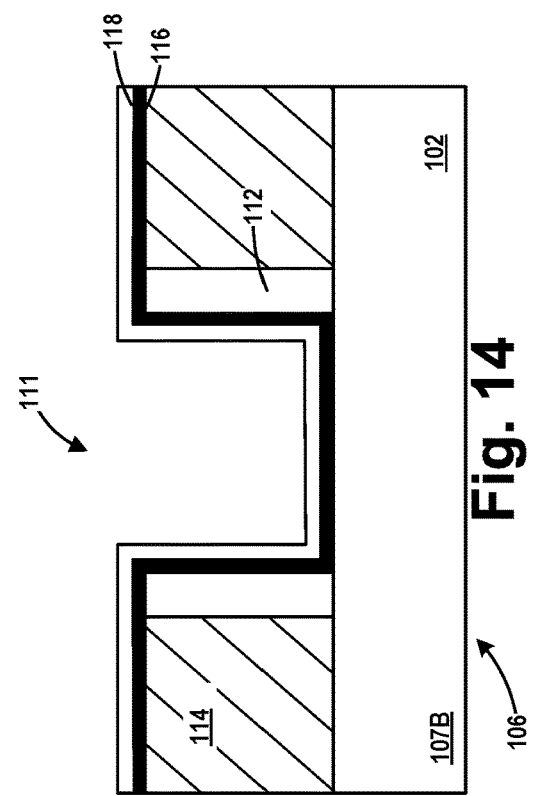
Figure 14:
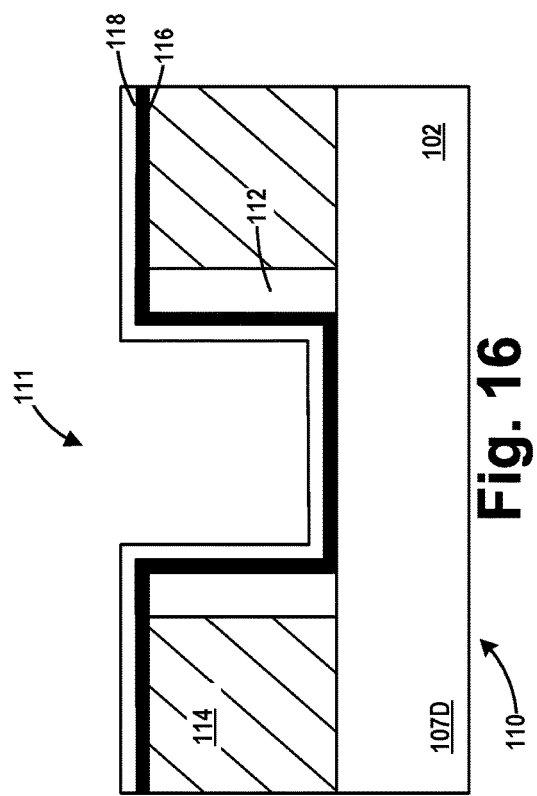
Figure 15:
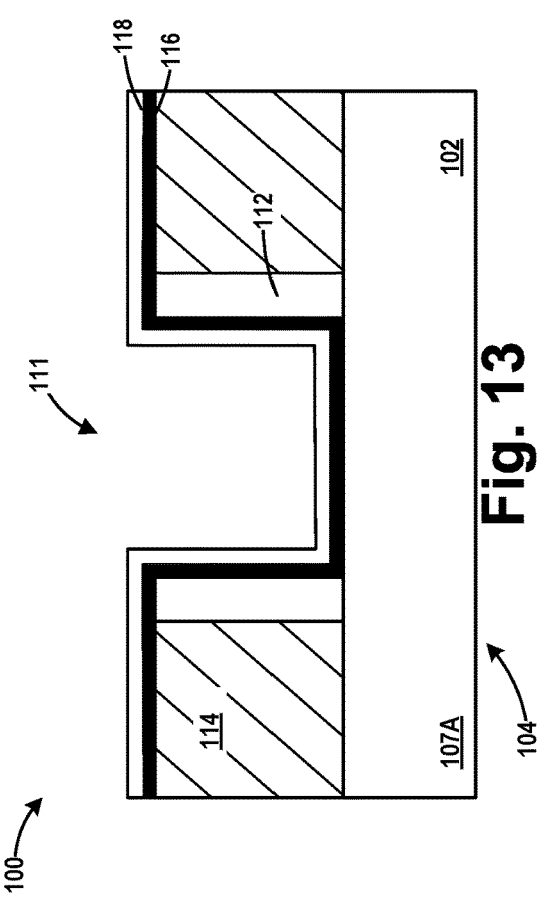
Figure 16:
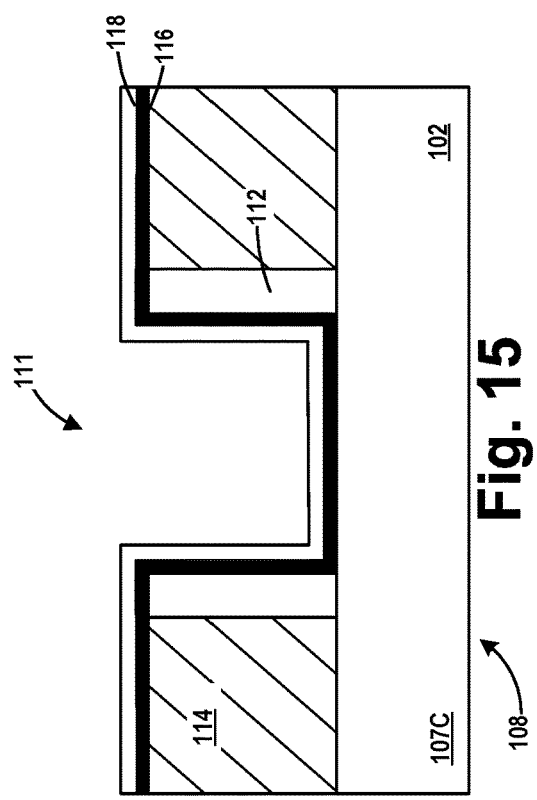
Figure 17:
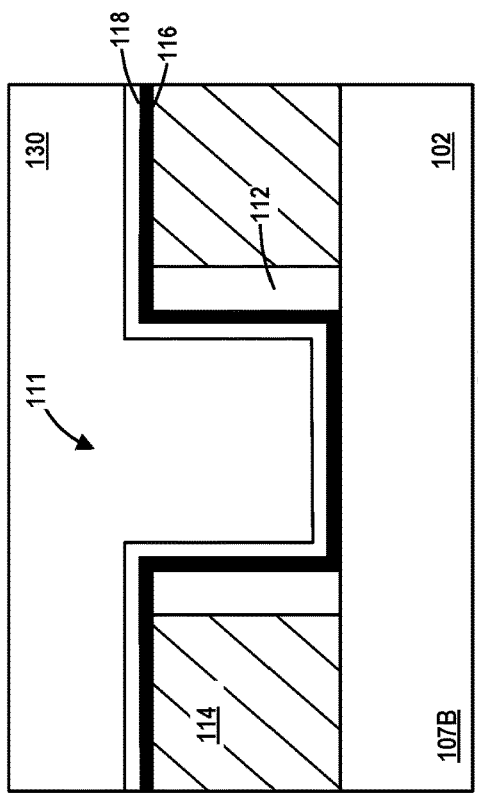
Figure 18:
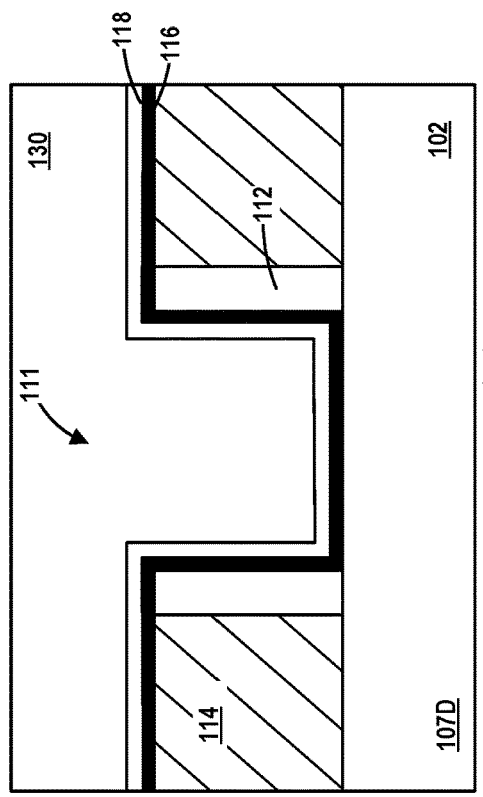
Figure 19:
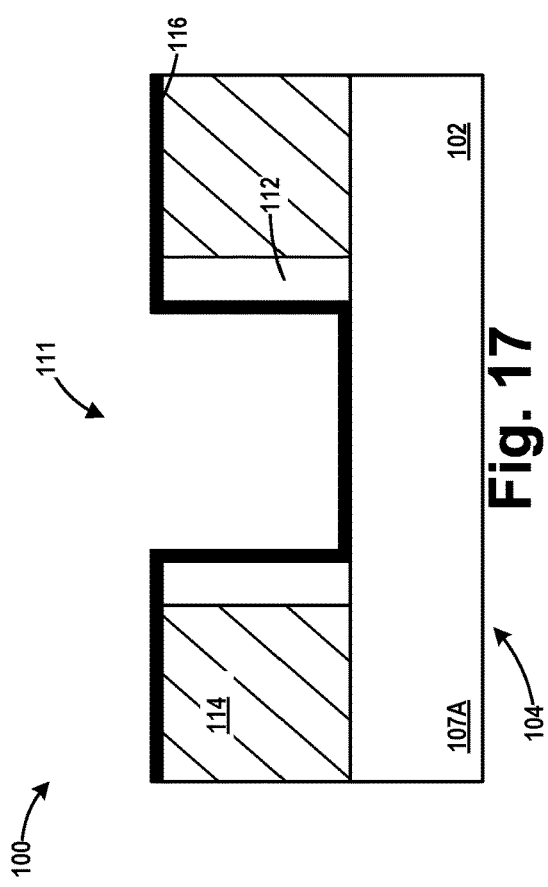
Figure 20:
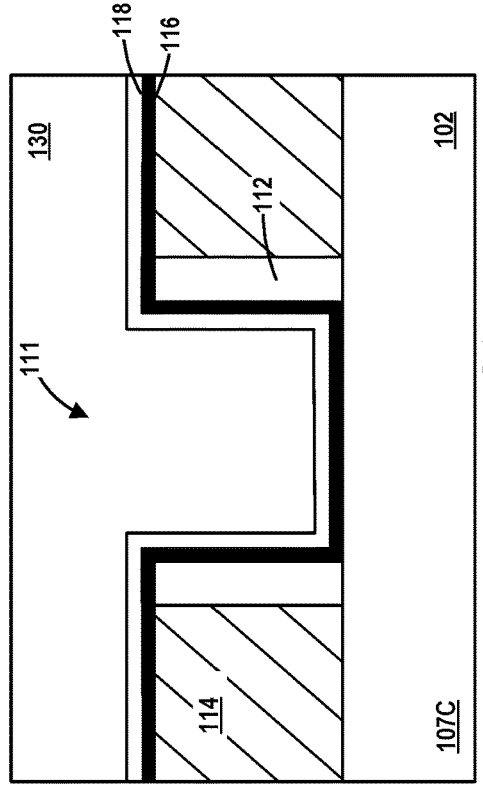
Figure 21:
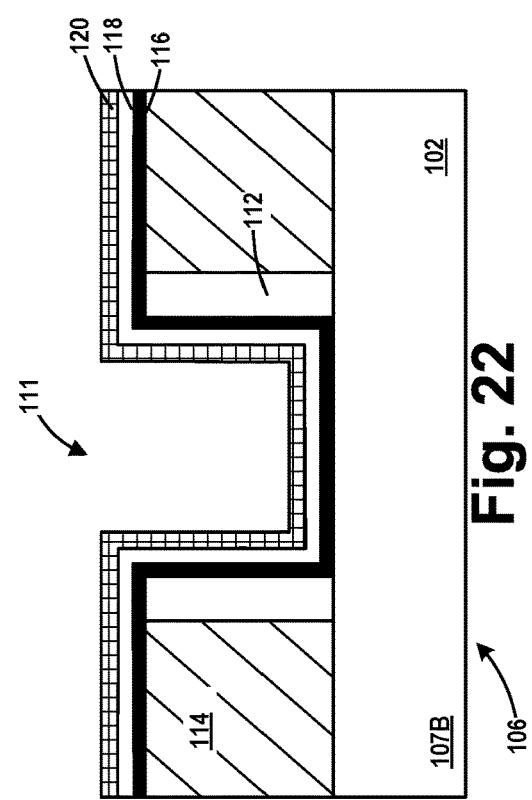
Figure 22:
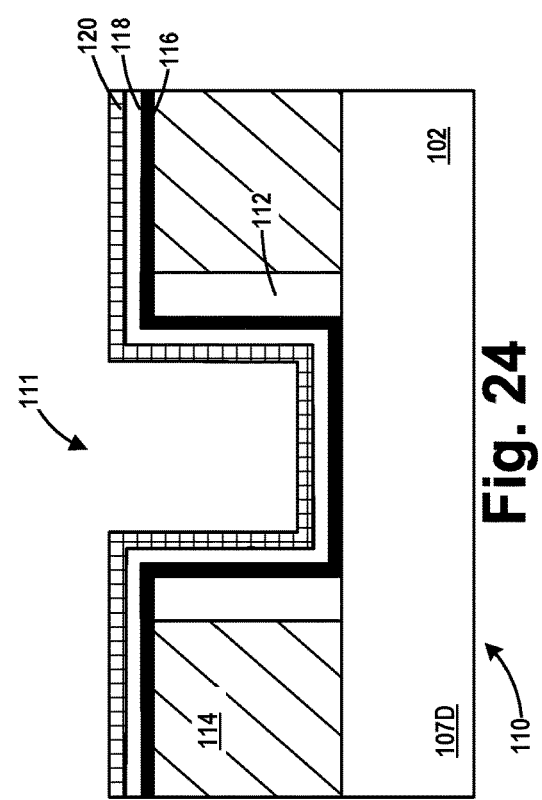
Figure 23:
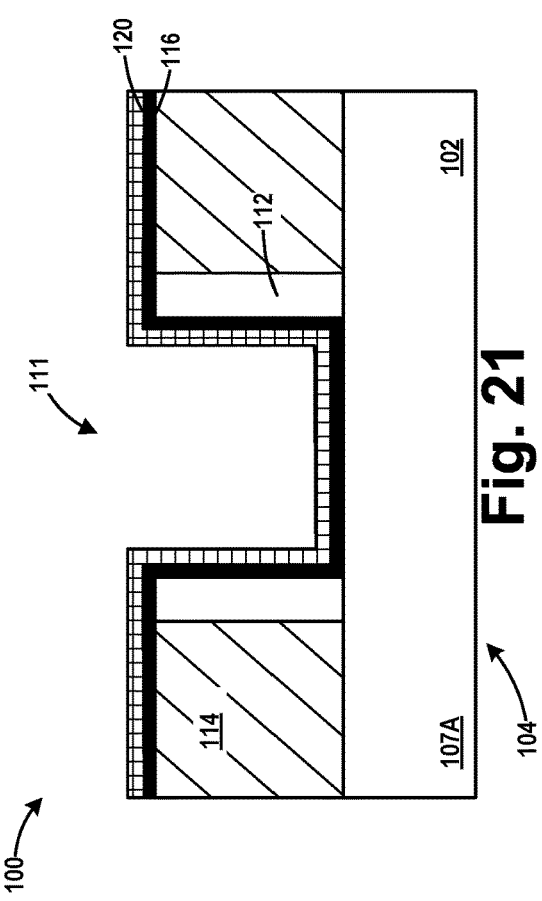
Figure 24:
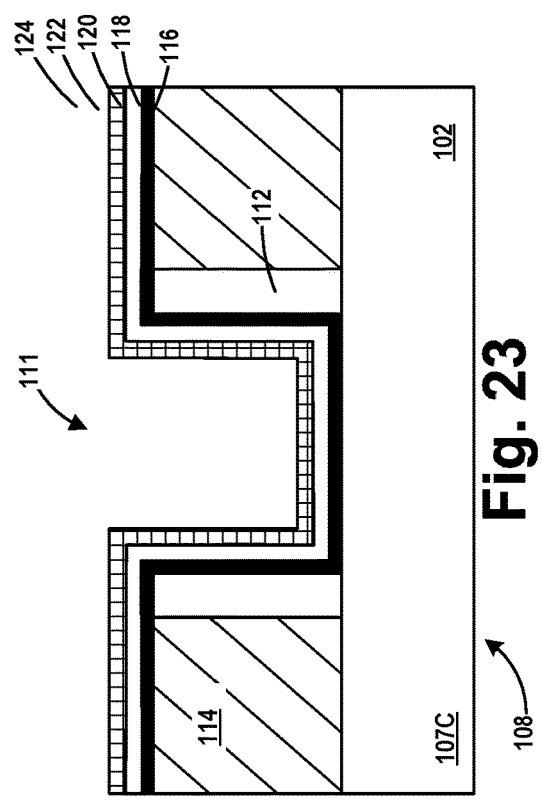
Figure 37:
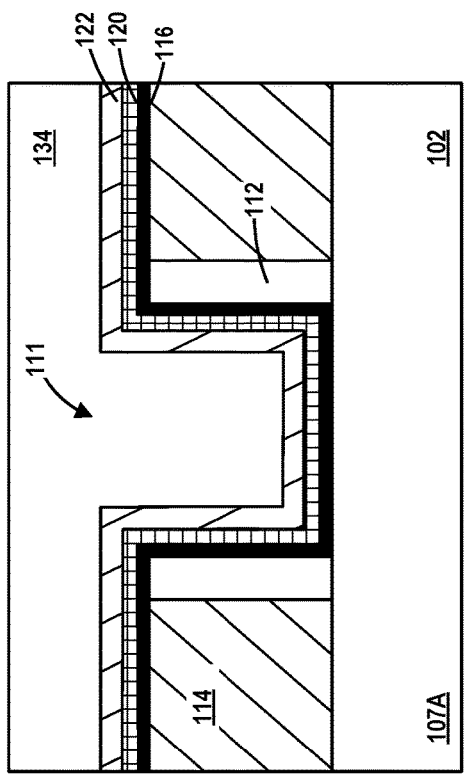
Figure 38:
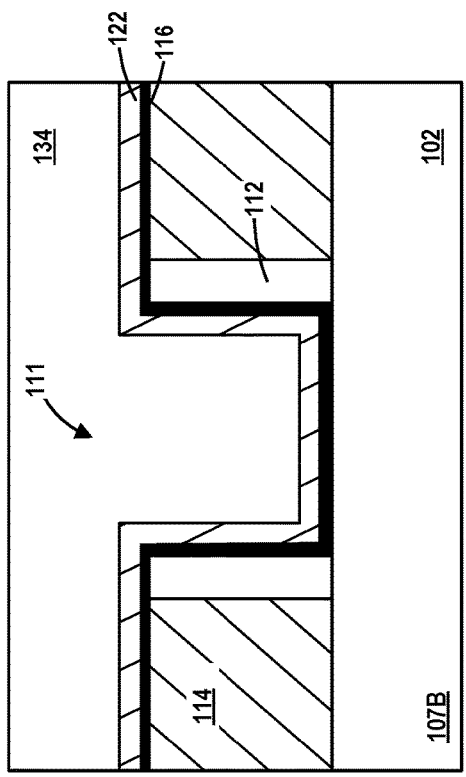
Figure 39:
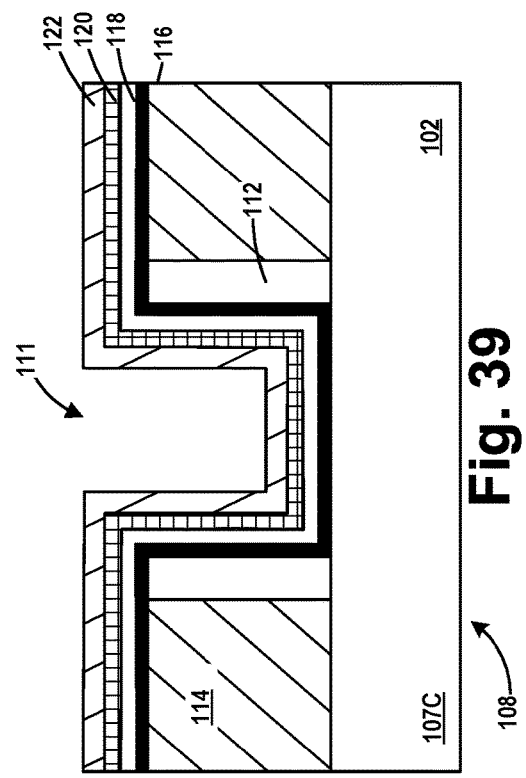
Figure 40:
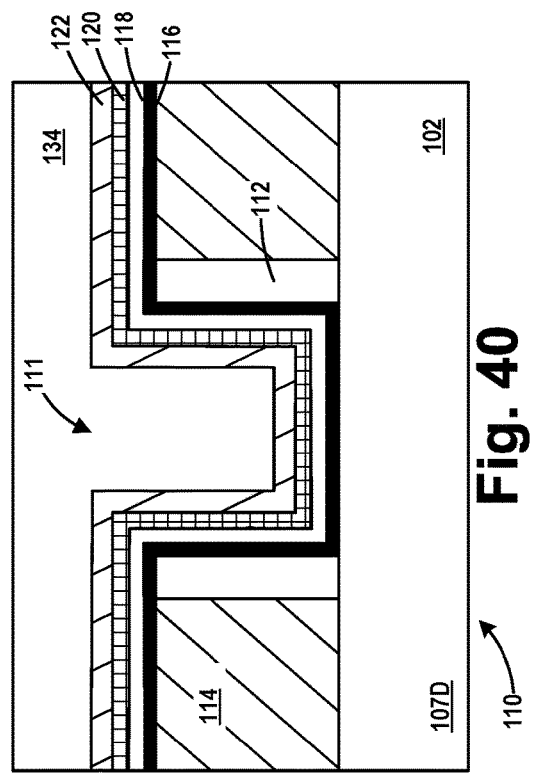
Figure 41:
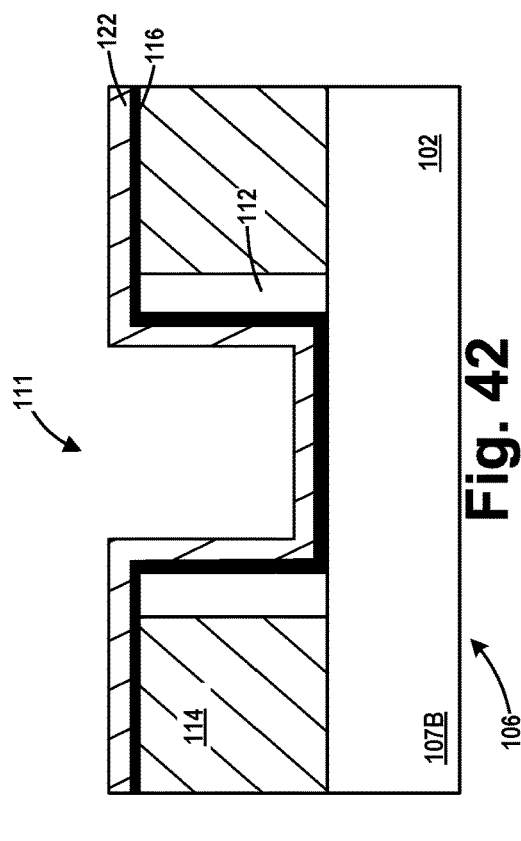
Figure 42:
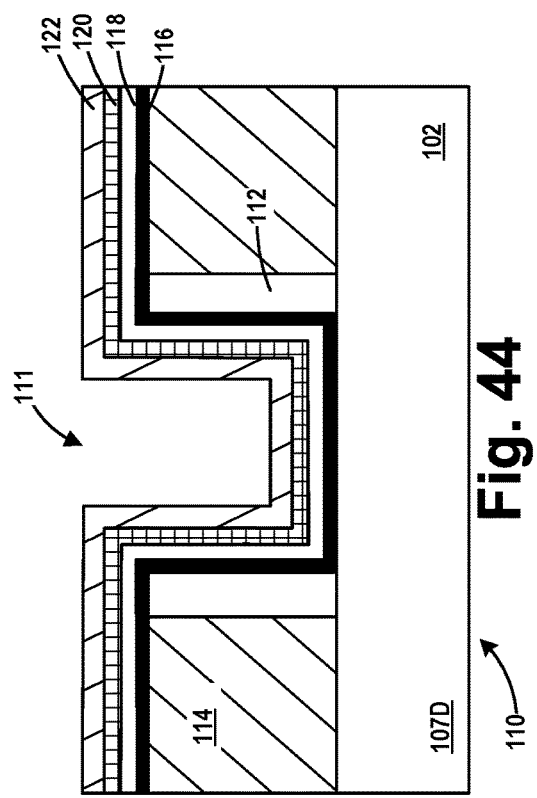

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1-70 depict various illustrative novel methods disclosed herein for forming an integrated circuit (IC) product 100 comprising transistor devices with different threshold voltage levels. In the examples depicted herein, the IC product 100 will be formed on a semiconductor substrate 102. As will be appreciated by those skilled in the art after a complete reading of the present application, the methods disclosed herein may be applied to forming various types or forms of transistor devices, such as, for example, FinFET devices, planar transistor devices, etc. As described more fully below, the present subject matter will be disclosed in the illustrative situation where four different transistor devices 104, 106, 108 and 110—each having a different threshold voltage (Vt)—will be formed on the semiconductor substrate 102. These devices will be formed so as to be either an SLVT (super low Vt) device, an LVT (low Vt) device, an RVT (regular Vt) device or an HVT (high Vt) device. In one illustrative embodiment, achieving the desired difference in the threshold voltages of the various devices is accomplished by adjusting the total thickness of work-function adjusting materials within the final gate structure of the device.

In general, for a PFET transistor device, as the thickness of the work-function material(s) increases, the threshold voltage of the PFET transistor will decrease, thereby producing a PFET transistor with a relatively faster switching speed and a relatively greater leakage current. Conversely, for a PFET transistor device, as the thickness of the work-function material(s) decreases, the threshold voltage of the PFET transistor will increase, thereby producing a PFET transistor with a relatively slower switching speed and a relatively smaller leakage current. For an NFET transistor the reverse is true. That is, for an NFET transistor device, as the thickness of the work-function material(s) increases, the threshold voltage of the NFET transistor will increase, thereby producing an NFET transistor with a relatively slower switching speed and a relatively smaller leakage current. Conversely, for an NFET transistor device, as the thickness work-function material(s) decreases, the threshold voltage of the NFET transistor will decrease, thereby producing an NFET transistor with a relatively faster switching speed and a relatively greater leakage current.

The devices 104, 106, 108 and 110 are formed on active regions 107A-D (collectively referenced using the numeral 107), respectively, formed in the substrate 102. The active regions 107 are isolated from one another and other active regions by isolation material, e.g., silicon dioxide, positioned in trenches formed in the substrate 102. The absolute value of the threshold voltage of each of these devices, as well as the magnitude of the difference between the threshold voltage levels of each of these devices, may vary depending upon the particular application and upon further advances in device technology and device scaling. The transistors disclosed herein may be NFET transistors or they may be PFET transistors. The various transistor devices disclosed herein may be formed immediately adjacent one another on the substrate 102 or they may be formed in different regions or areas of the substrate 102. The gate-length of all of the transistors may be the same or they may have gate lengths of differing dimensions, e.g., some of the transistors may be short-channel devices while other devices may be long-channel devices.

As noted above, the example below depicts the formation of four different classes or categories of transistors having different threshold voltages. However, as will be appreciated by those skilled in the art after a complete reading of the present application, the methods disclosed herein may be performed to form any desired number of such classes of transistors. For example, the methods disclosed herein may be performed to form an IC product with just two different classes or categories of transistors having different threshold voltage levels, e.g., the IC product may only contain a plurality of SLVT devices 104 and a plurality of HVT devices 110. Of course, as noted above, these different classes of transistor devices may be NFET or PFET transistors.

The substrate 102 may have a variety of configurations, such as a semiconductor-on-insulator (SOI) configuration that includes a base semiconductor layer, a buried insulation layer positioned on the base semiconductor layer and an active semiconductor layer positioned on the buried insulation layer. Alternatively, the substrate 102 may have a simple bulk configuration, like that depicted in the attached drawings. The substrate 102 may be made of silicon or it may be made of semiconductor materials other than silicon. Thus, the terms "substrate" or "semiconductor substrate" should be understood to cover all semiconducting materials and all forms of such materials. In the example where the various transistor devices are FinFET devices, the substrate 102 depicted in the drawings would be a fin of such devices. The drawings are cross-sectional views taken through the transistor devices in the gate length (GL) or current-transport direction of the transistor devices. The drawings herein are not to scale.

The gate structures of the various transistor devices disclosed herein will be formed using replacement-gate manufacturing techniques. Of course, the materials of the gate structures for N-type transistor devices may be different from the materials of the gate structures for P-type transistor devices. Accordingly, FIGS. 1-4 depict the product 100 at a point in time where sacrificial (or "dummy") gate structures 103, with a sacrificial gate cap 105 formed thereabove, were formed across the substrate 102 for each of the transistors. Also depicted in the drawings is an illustrative and representative layer of insulating material 114, e.g., silicon dioxide. In practice, the layer of insulating material 114 may be comprised of multiple layers of material made from the same or different insulating materials. Of course, there may be other layers of materials and/or components of a real-world transistor device that are not depicted in the drawings, e.g., regions of epi semiconductor material in the source/drain regions of the devices, contact etch-stop layers, doped implant regions, etc.

In one illustrative and non-limiting process flow, each of the sacrificial structures 103 comprises a sacrificial gate insulation layer (e.g., silicon dioxide—not separately shown) and a sacrificial gate electrode material (e.g., polysilicon or amorphous silicon—not separately shown). As noted above, a sacrificial gate cap 105 (e.g., silicon nitride) is positioned above each of the sacrificial gate structures 103. In one illustrative process flow, the sacrificial gate structures 103 (with the gate cap 105 thereabove) are initially formed as continuous line-type structures that extend across substantially the entire substrate 102, i.e., across both active regions and isolation regions located between active regions. The long continuous line-type sacrificial gate structures 103/gate cap 105 structures may be formed by depositing the materials for the sacrificial gate structures 103 as well as a layer of material for the sacrificial gate caps 105 across the entire substrate 102, forming a patterned gate etch mask (not shown) above the deposited layer of the material for the sacrificial gate caps 105, and performing one or more etching processes through the patterned gate etch mask to remove the exposed portions of sacrificial gate cap material and, thereafter, the exposed portions of the sacrificial gate materials.

Next, still referencing FIGS. 1-4, an illustrative sidewall spacer structure 112 (e.g., silicon nitride, a low-k material (k value of 3.3 or less), etc.) was formed adjacent the long continuous line-type sacrificial gate structures 103 and gate caps 105. The spacer structure 112 may be formed by depositing a conformal layer of spacer material and thereafter performing an anisotropic etching process. In the examples depicted herein, the spacer structure 112 is depicted as a single sidewall spacer. In practice, the spacer structure 112 may be comprised of a plurality of sidewall spacers that may or may not be comprised of different materials.

Various process operations are typically performed with the sacrificial gate structures 103, gate caps 105 and spacer structures 112 in position, e.g., source/drain implantation processes, the formation of epi semiconductor material in the source/drain regions of the transistors, etc. Then, a conformal contact etch stop layer (not shown, e.g., silicon nitride) may be formed on the product 100 and above the regions of epi semiconductor material. At that point, one or more layers of insulating material 114 (e.g., silicon dioxide) was formed across the product 100 so as to over-fill the open spaces between the spacer structures 112. Thereafter, a chemical mechanical planarization (CMP) and/or etch-back process was performed to planarize the upper surface of the layer of insulating material 114 with the upper surface of the sacrificial gate caps 105.

FIGS. 5-8 depict the product 100 after various process operations were performed to remove the sacrificial gate structures 103 so as to form a replacement gate cavity 111 for each of the devices 104, 106, 108 and 110. More specifically, in one illustrative process flow, one or more CMP process operations were performed to remove the sacrificial gate caps 105 and portions of the insulating material 114. This process operation exposes the underlying sacrificial gate structures 103. At that point, at least the sacrificial gate electrode portion of the sacrificial gate structures 103 was removed so as to form the plurality of replacement gate cavities 111 that are located laterally between the spacers 112. In some cases, the entirety of the sacrificial gate structures 103 may be removed so as to expose the upper surface 102S of the substrate 102 within the replacement gate cavities 111. In the case where the transistor devices are FinFET devices, the surface 102S would be the upper surface of a fin. In some applications, after the removal of the sacrificial gate insulation layer and the sacrificial gate structure, a thin layer of silicon dioxide (not shown) may be formed on the surface 102S of the substrate 102.

The present subject matter generally involves, among other things, the formation of a at least one conformal sacrificial metal-containing material layer 118 ("SMCM layer") in the replacement gate cavities 111 of all of the different transistor devices, and the formation of one or more conformal metal-containing material layers ("MCM layers") in one or more of the replacement gate cavities 111 above the conformal SMCM layer 118. The methods disclosed below also involve the selective removal of portions of the conformal SMCM layer 118 from within the gate cavity 111 of one of the transistor devices while leaving other portions of the conformal SMCM layer 118 in position within one or more of the replacement gate cavities 111 of the other transistor devices, as described more fully below. In general, the conformal MCM layers and the conformal SMCM layer 118 have a generally U-shaped configuration when viewed in a cross-section taken through these materials in a direction corresponding to the gate length (GL) direction of the transistor devices.

The conformal MCM layers may be made of any desired metal-containing material, they may be formed to any desired thickness and they may be formed by performing any type of conformal deposition process, e.g., a conformal ALD process. Moreover, any desired number of such conformal MCM layers may be formed within the gate cavity 111 of any particular transistor using the methods disclosed herein. In the case where a plurality of conformal MCM layers are formed in the replacement gate cavity 111 of a particular transistor, the conformal MCM layers need not all be made of the same material, but such a situation may arise in some applications. Of course, the precise material(s) for the conformal MCM layers may vary depending upon whether the transistor device under construction is an NFET device or a PFET device. By way of example only, the conformal MCM layers referenced herein may comprise any of the following: a work-function adjusting material, titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi), lanthanum (La), TiAlC, etc. If desired, dopant atoms may be added to the conformal MCM layers.

FIGS. 9-12 depict the product 100 after a conformal high-k (k value of 10 or greater) gate insulation layer 116 was formed in the replacement gate cavity 111 of each of the devices 104, 106, 108 and 110. In some applications, the high-k gate insulation layer 116 may be formed on and in contact with the upper surface 102S of the substrate 102. The high-k gate insulation layer 116 may be formed to any desired thickness and it may comprise a variety of different materials, e.g., tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$), etc. Although the high-k gate insulation layer 116 depicted herein is shown as a single layer of material, in some applications, multiple conformal gate insulation layers may be formed in each of the replacement gate cavities 111.

FIGS. 13-16 depict the product 100 after a conformal deposition process was performed to form the above-referenced conformal SMCM layer 118 above the high-k gate insulation layer 116 in the replacement gate cavities 111 of each of the devices 104, 106, 108 and 110. In one illustrative example, the conformal SMCM layer 118 may be formed on and in contact with the high-k gate insulation layer 116. The conformal SMCM layer 118 may be comprised of any metal-containing material that provides sufficient protection for the underlying high-k gate insulation layer 116 during various process operations, such as etching processes, that are performed on the various transistor devices after the formation of the high-k gate insulation layer 116. It is important to protect the high-k gate insulation layer 116 to insure that the final transistor devices operate as intended by the design process. For example, if the high-k gate insulation material 116 were to the point where the underlying substrate material (in the channel region of the device) was exposed, the transistor device may simply be inoperable. The conformal SMCM layer 118 may be formed to any desired thickness so as to provide sufficient protection of the high-k gate insulation layer 116 during process operations performed after the formation of the SMCM layer 118. The SMCM layer 118 may be formed by performing any type of conformal deposition process, e.g., a conformal ALD process. The single conformal SMCM layer 118 depicted in the drawings is representative in nature in that it may be comprised of multiple layers of material, e.g., a bi-layer construction. Additionally, in some applications, the conformal SMCM layer 118 may be comprised of the same material as one of the conformal MCM layers formed in the replacement gate cavities 111 for the four illustrative transistor devices. In other applications, the conformal SMCM layer 118 may be made of a material that is different from all of the material(s) used for the conformal MCM layers formed in the replacement gate cavities 111 for the four transistor devices. In one particular illustrative example, the conformal SMCM layer 118 may be comprised of titanium nitride and, based upon current day technology, it may have a thickness of at least about 1.5 nm.

FIGS. 17-20 depict the product 100 after several process operations were performed. First, a first patterned etch mask 130, e.g., a patterned layer of photoresist/BARC, was formed on the product 100 by performing traditional manufacturing techniques. The first patterned etch mask 130 covers the device 106, the device 108 and the device 110 while leaving the device 104 exposed for further processing. Next, with the first patterned etch mask 130 in position, one or more etching processes were performed to remove a first portion of the conformal SMCM layer 118 on the device 104. In one illustrative embodiment, this process operation exposes the high-k gate insulation layer 116 in the device 104. Note that the conformal SMCM layer 118 remains in position on the other three devices during this etching process.

FIGS. 21-24 depict the product 100 after several process operations were performed. First, the first patterned etch mask 130 was removed. Next, a conformal deposition process was performed to form a first conformal MCM layer 120 in the replacement gate cavities 111 of each of the devices 104, 106, 108 and 110. In one illustrative example, the first conformal MCM layer 120 may be formed on and in contact with the high-k gate insulation layer 116 on the device 104 as well as on and in contact with the remaining portions of the conformal SMCM layer 118 positioned in the gate cavities 111 of the device 106, the device 108 and the device 110. As noted above, the first conformal MCM layer 120 may be of any desired metal-containing material and it may be formed to any desired thickness. In one particular illustrative example, the first conformal MCM layer 120 may be comprised of titanium nitride and, based upon current day technology, it may have a thickness of about 1.0 or less nm.

FIGS. 25-28 depict the product 100 after a second patterned etch mask 132, e.g., a patterned layer of photoresist/BARC, was formed on the product 100 by performing traditional manufacturing techniques. The second patterned etch mask 132 covers the device 104, the device 108 and the device 110 while leaving the device 106 exposed for further processing.

FIGS. 29-32 depict the product 100 after several process operations were performed. First, with the second patterned etch mask 132 in position, one or more etching processes were performed to remove the first conformal MCM layer 120 and a second portion of the conformal SMCM layer 118 on the device 106 (FIG. 30). In one illustrative embodiment, this process operation exposes the high-k gate insulation layer 116 in the device 106. Note that the conformal SMCM layer 118 remains in position on the device 108 and the device 110 during this etching process. Thereafter, the second patterned etch mask 132 was removed from the product 100.

FIGS. 33-36 depict the product 100 after another conformal deposition process was performed to form a second conformal MCM layer 122 in the replacement gate cavities 111 of each of the devices 104, 106, 108 and 110. In one illustrative example, the second conformal MCM layer 122 may be formed on and in contact with the high-k gate insulation layer 116 on the device 106 as well as on and in contact with the first conformal MCM layer 120 positioned in the gate cavities 111 of the device 104, the device 108 and the device 110. As noted above, the second conformal MCM layer 122 may comprise any desired metal-containing material and it may be formed to any desired thickness. In one particular illustrative example, the second conformal MCM layer 122 may be comprised of titanium nitride and, based upon current day technology, it may have a thickness of about 0.8-2.0 nm.

FIGS. 37-40 depict the product 100 after a third patterned etch mask 134, e.g., a patterned layer of photoresist/BARC, was formed on the product 100 by performing traditional manufacturing techniques. The third patterned etch mask 134 covers the device 104, the device 106 and the device 110 while leaving the device 108 exposed for further processing.

Figure 43:
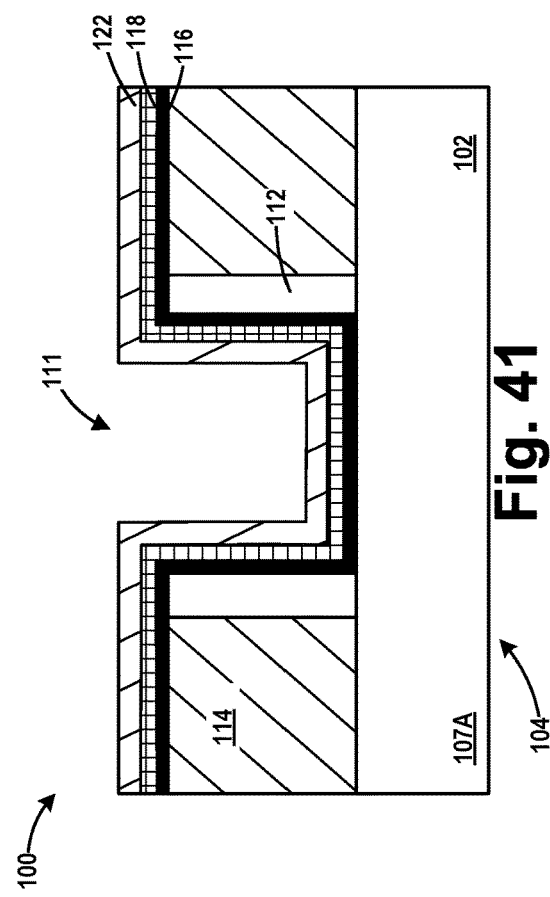
Figure 44:
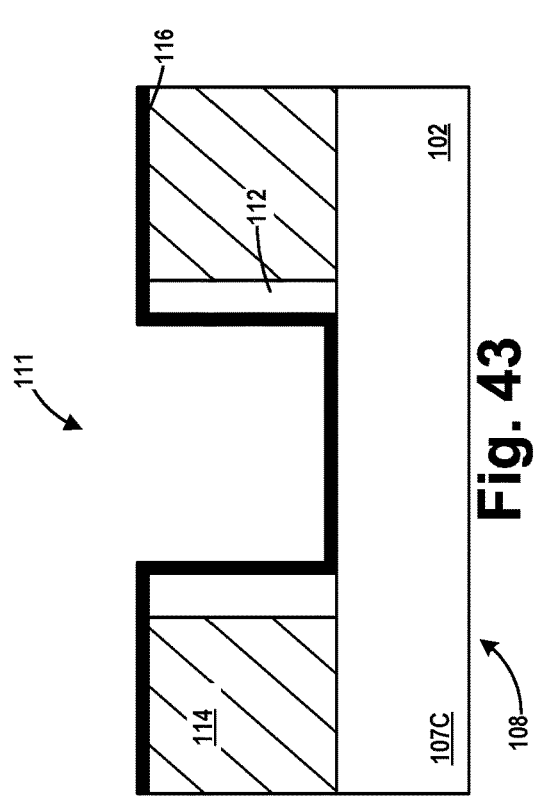
Figure 45:
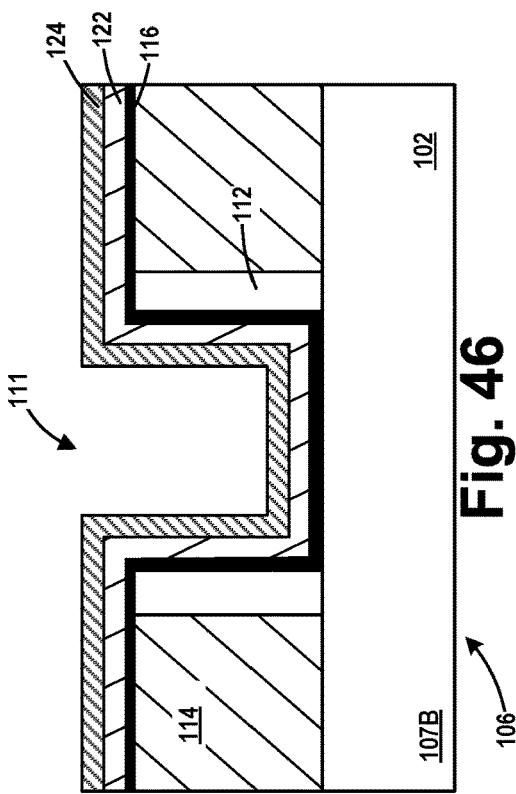
Figure 46:
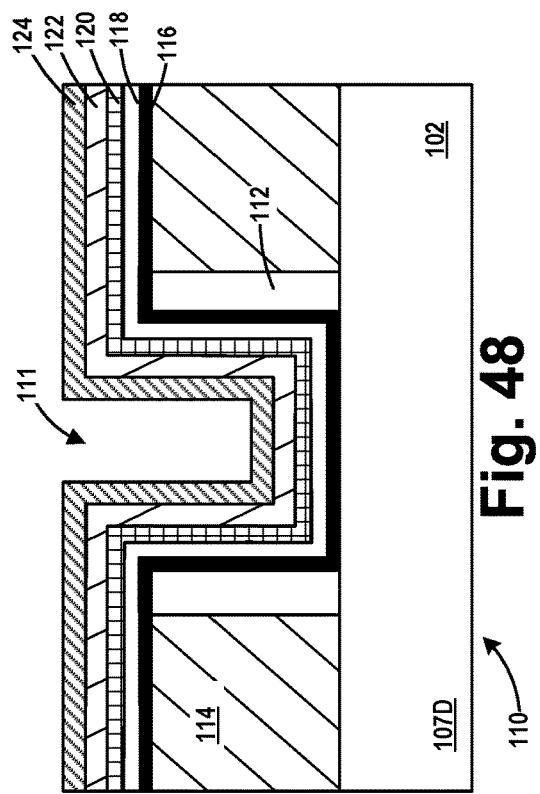
Figure 47:
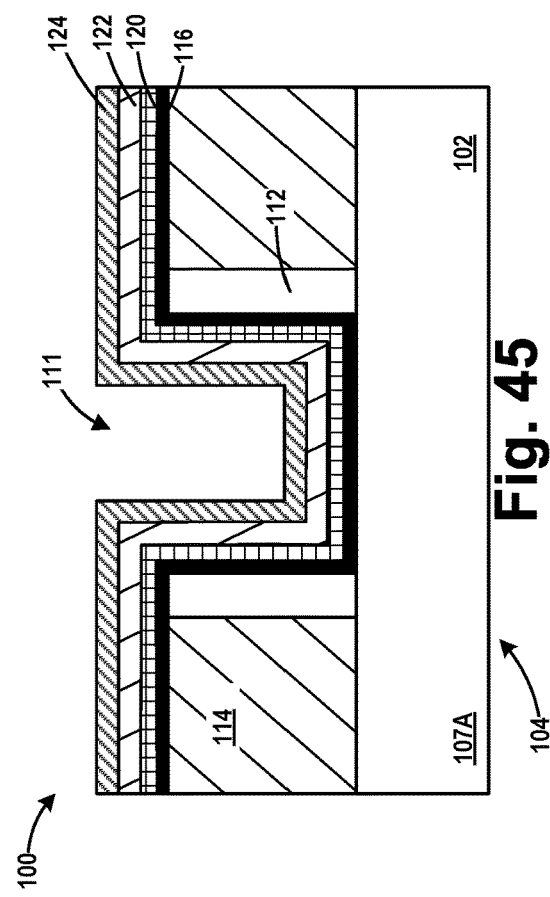
Figure 48:
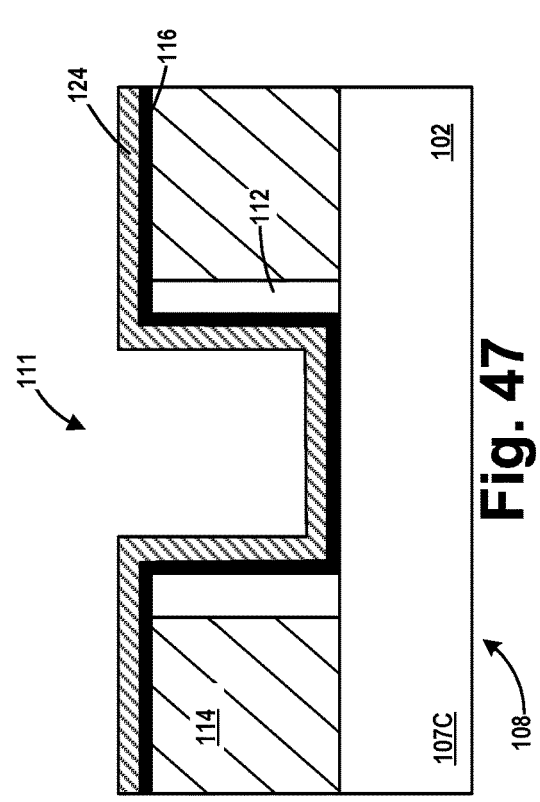
Figure 49:
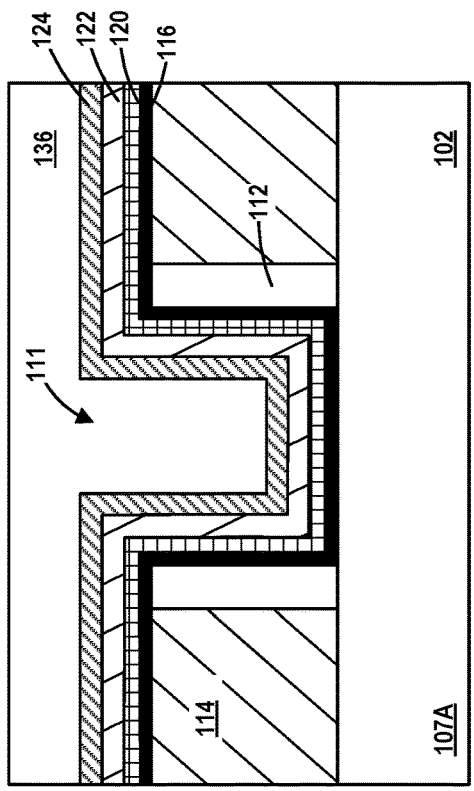
Figure 50:
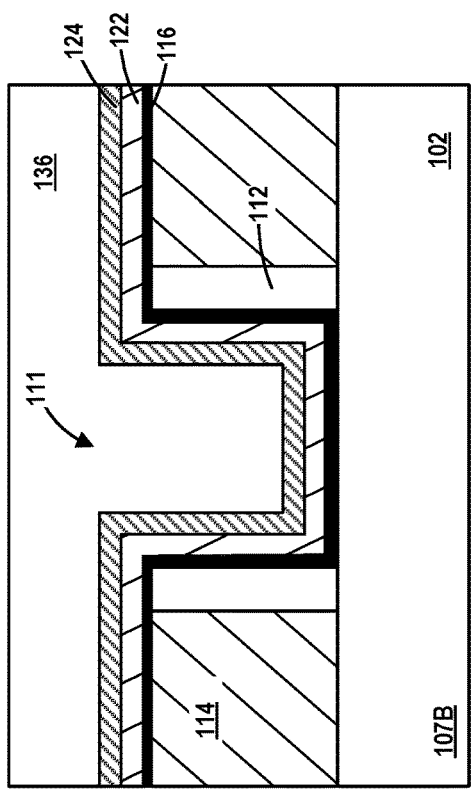
Figure 51:
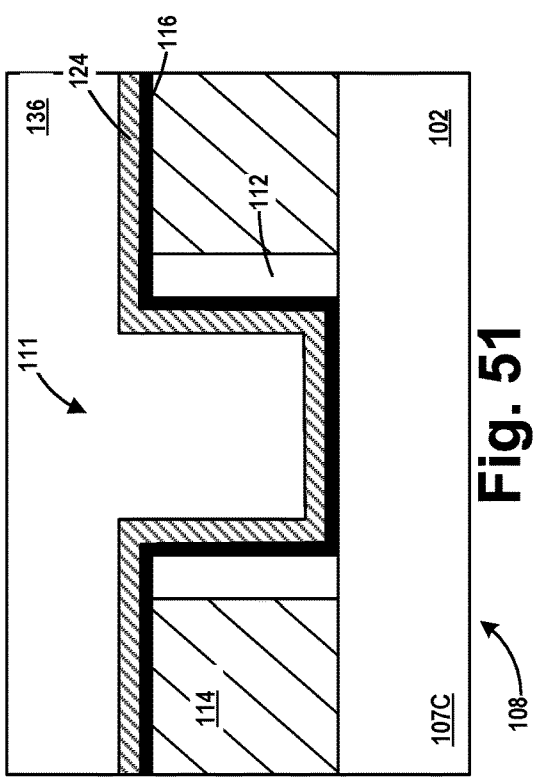
Figure 52:
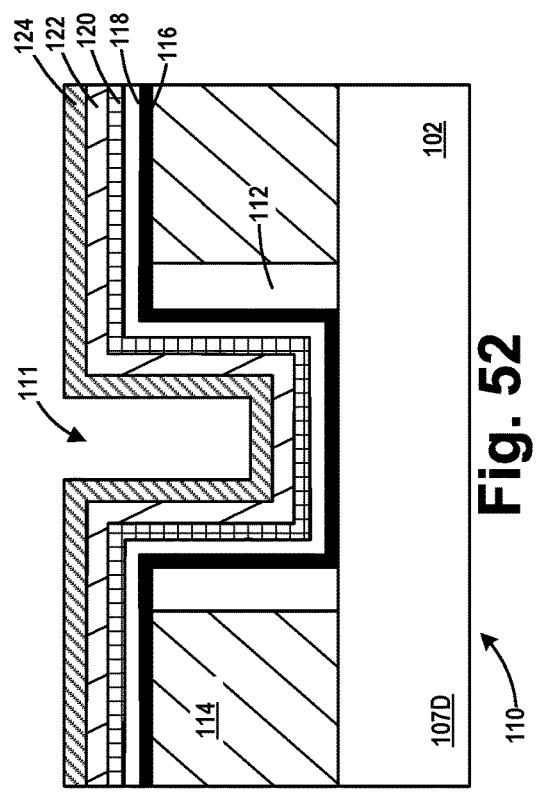
Figure 53:
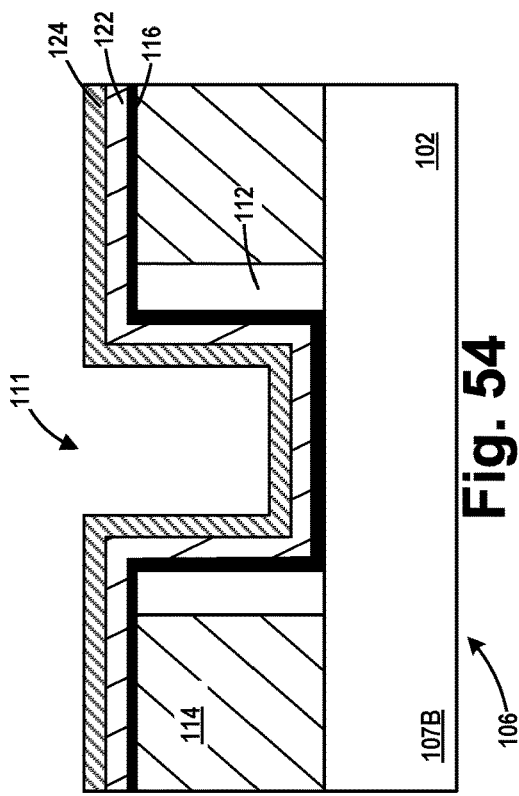
Figure 54:
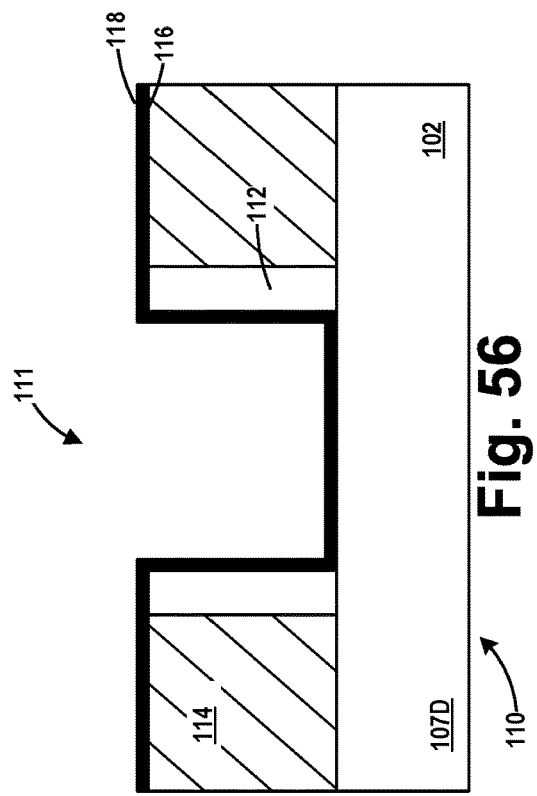
Figure 55:
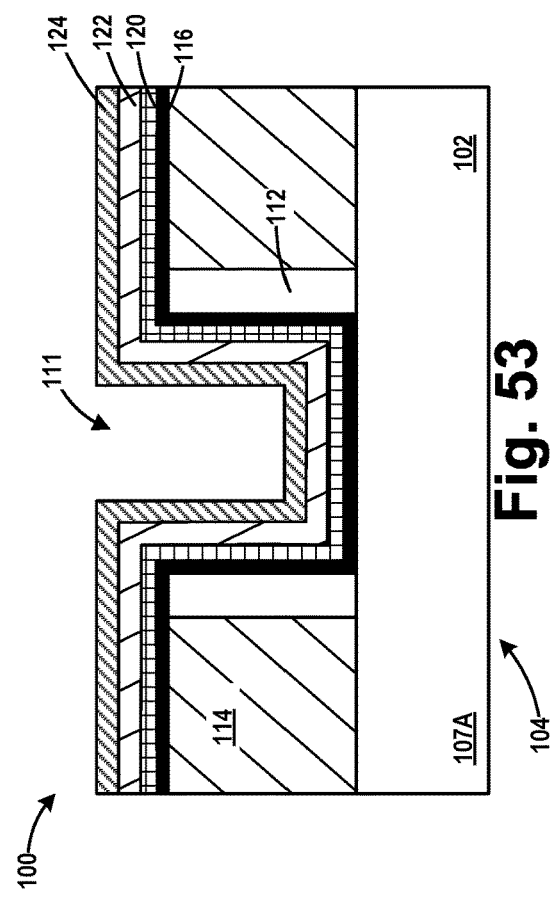

FIGS. 41-44 depict the product 100 after several process operations were performed. First, with the third patterned etch mask 134 in position, one or more etching processes were performed to remove the second conformal MCM layer 122, the first conformal MCM layer 120 and a third portion of the conformal SMCM layer 118 on the device 108 (FIG. 43). In one illustrative embodiment, this process operation exposes the high-k gate insulation layer 116 in the device 108. Note that the conformal SMCM layer 118 remains in position on the device 110 during this etching process. Thereafter, the third patterned etch mask 134 was removed from the product 100.

FIGS. 45-48 depict the product 100 after another conformal deposition process was performed to form a third conformal MCM layer 124 in the replacement gate cavities 111 of each of the device 104, the device 106, the device 108 and the device 110. In one illustrative example, the third conformal MCM layer 124 may be formed on and in contact with the high-k gate insulation layer 116 on the device 108 as well as on and in contact with the second conformal MCM layer 122 positioned in the gate cavities 111 of the device 104, the device 106 and the device 110. As noted above, the third conformal MCM layer 124 may comprise any desired metal-containing material and it may be formed to any desired thickness. In one particular illustrative example, the third conformal MCM layer 124 may be comprised of titanium nitride and, based upon current day technology, it may have a thickness of about 0.8-2.0 nm.

FIGS. 49-52 depict the product 100 after a fourth patterned etch mask 136, e.g., a patterned layer of photoresist/BARC, was formed on the product 100 by performing traditional manufacturing techniques. The fourth patterned etch mask 136 covers the device 104, the device 106 and the device 108 while leaving the device 110 exposed for further processing.

Figure 56:
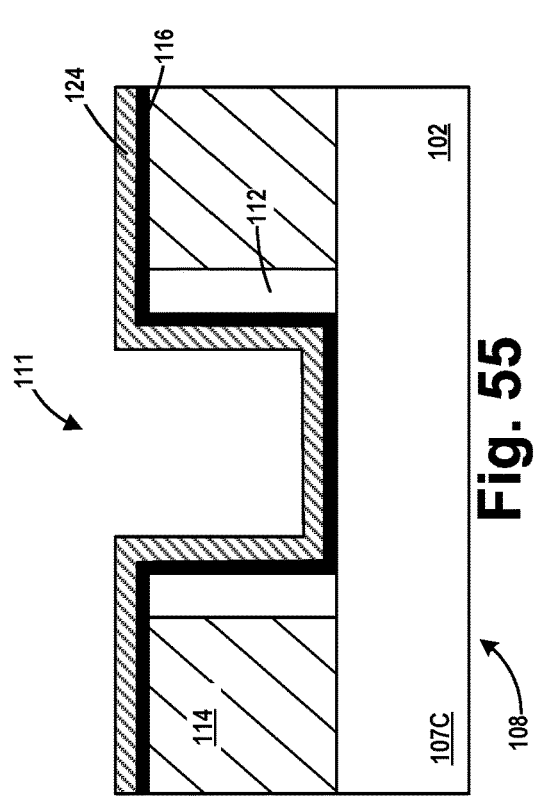
Figure 57:
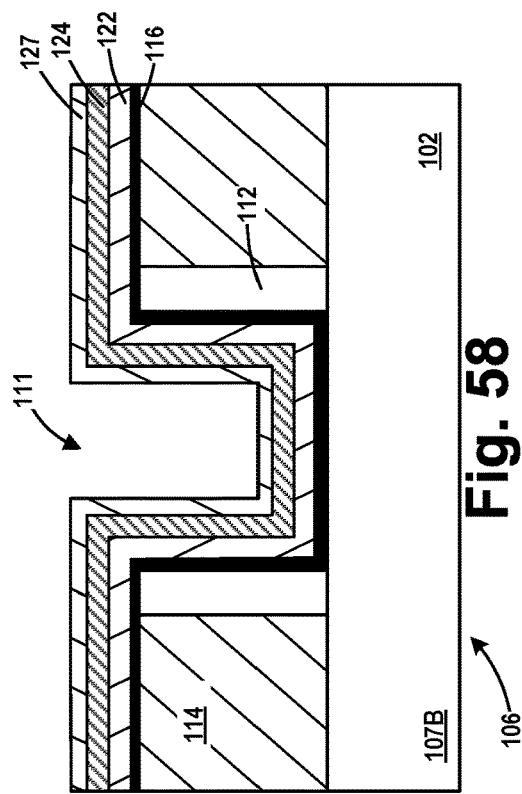
Figure 58:
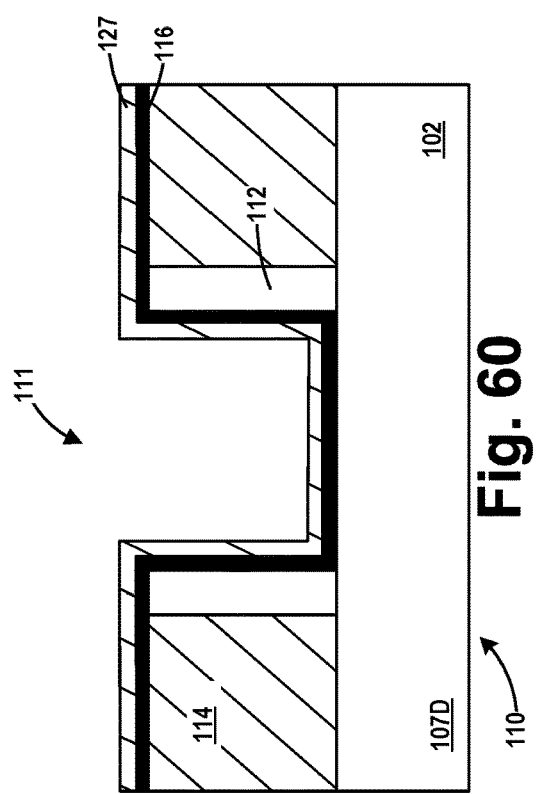
Figure 59:
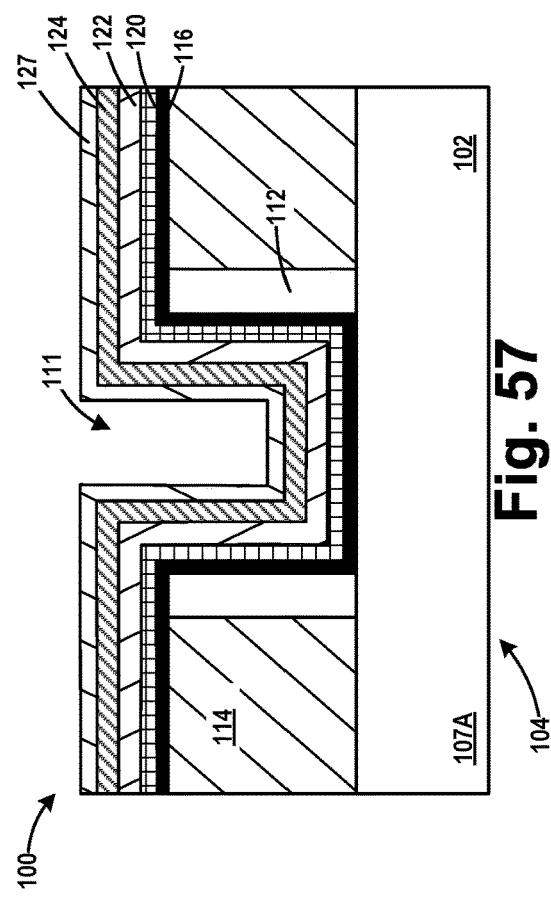
Figure 60:
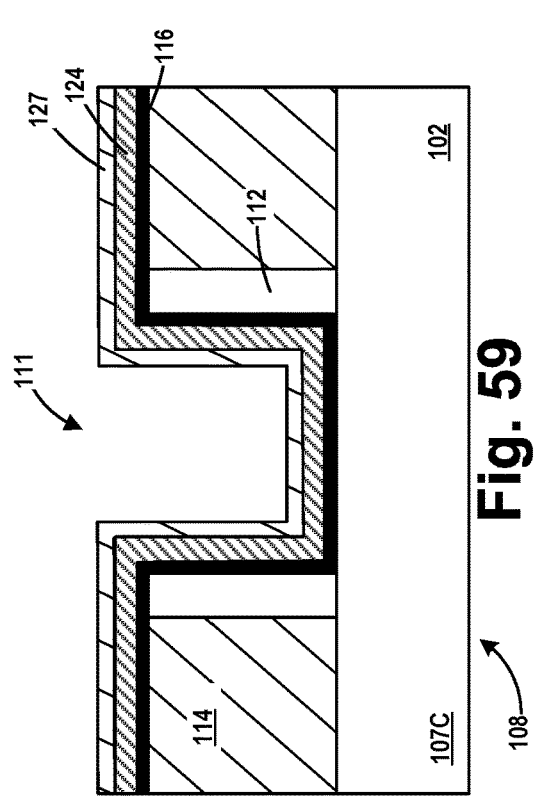
Figure 61:
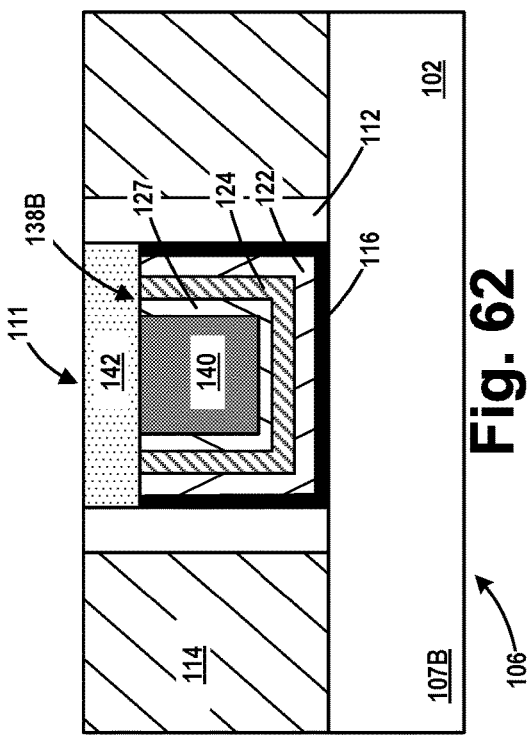
Figure 62:
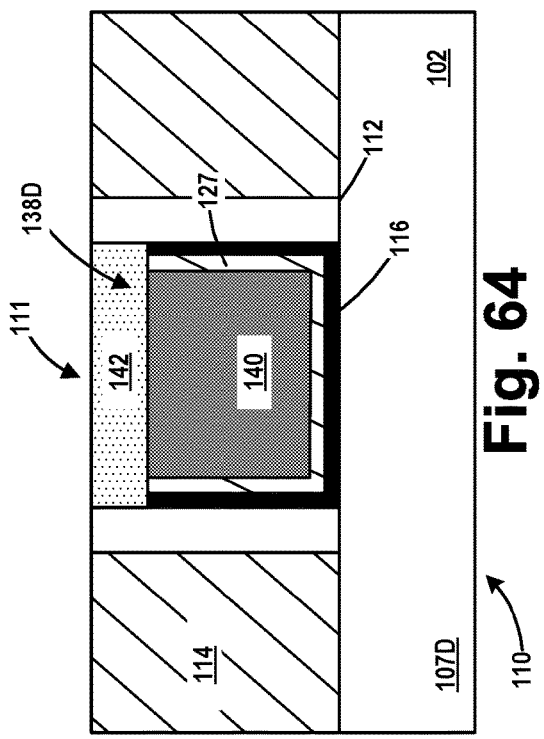
Figure 63:
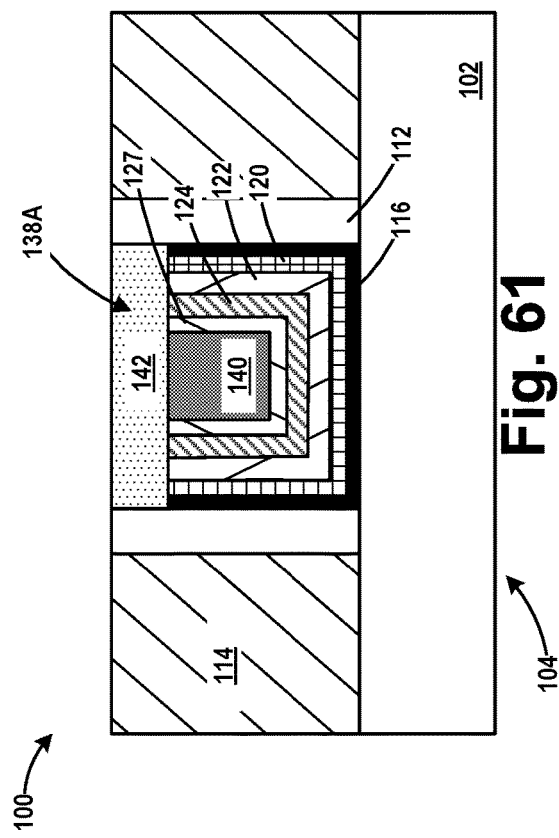
Figure 64:
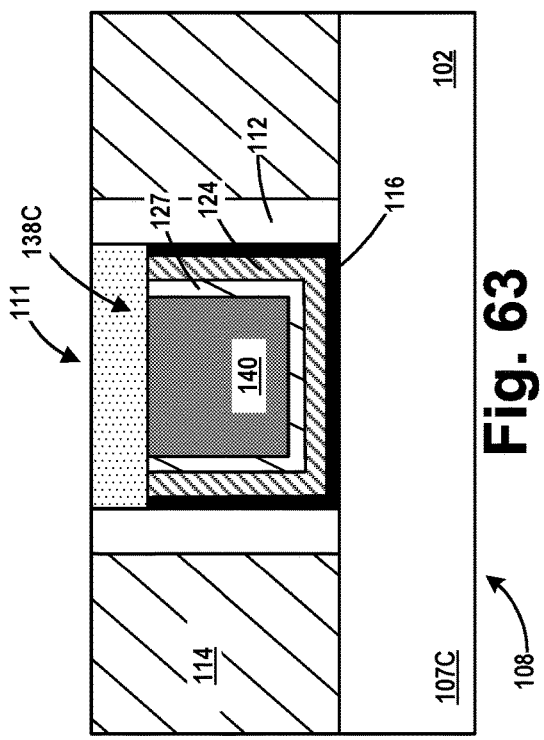

FIGS. 53-56 depict the product 100 after several process operations were performed. First, with the fourth patterned etch mask 136 in position, one or more etching processes were performed to remove the third conformal MCM layer 124, the second conformal MCM layer 122, the first conformal MCM layer 120 and a fourth portion of the conformal SMCM layer 118 on the device 110 (FIG. 56). In one illustrative embodiment, this process operation exposes the high-k gate insulation layer 116 in the device 110. Note that the conformal SMCM layer 118 has now been removed from all of the transistor devices. Thereafter, the fourth patterned etch mask 136 was removed from the product 100.

FIGS. 57-60 depict the product 100 after another conformal deposition process was performed to form a fourth conformal MCM layer 127 in the replacement gate cavities 111 of each of the devices 104, 106, 108 and 110. In one illustrative example, the fourth conformal MCM layer 127 may be formed on and in contact with the high-k gate insulation layer 116 on the device 110 as well as on and in contact with the third conformal MCM layer 124 positioned in the gate cavities 111 of the device 104, the device 106 and the device 108. As noted above, the fourth conformal MCM layer 127 may comprise any desired metal-containing material and it may be formed to any desired thickness. In one particular illustrative example, the fourth conformal MCM layer 127 may be comprised of titanium nitride and, based upon current day technology, it may have a thickness of about 0.8-2.0 nm. Note that, in the illustrative example just described, the fourth conformal MCM layer 127, the third conformal MCM layer 124, the second conformal MCM layer 122, the first conformal MCM layer 120 and the conformal SMCM layer 118 are all comprised of the same material, e.g., titanium nitride. However, as noted above, this is but one specific application of the methods disclosed herein and it should not be considered to be a limitation to any of the various inventions set forth in the attached claims.

At the point of processing depicted in FIGS. 57-60, traditional manufacturing operations may be performed to form the final gate structures 138A-D (collectively referenced using the numeral 138) for the transistor devices 104, 106, 108 and 110, respectively, and an associated final gate cap 142 for each of the devices. Accordingly, FIGS. 61-64 depict the product 100 wherein each of the of the gate structures 138 comprises an illustrative bulk conductive material 140. The bulk conductive material 140 may be comprised of a variety of different materials including, but not limited to, tungsten, cobalt, etc. In one illustrative process flow, a layer of the conductive material 140 may be blanket-deposited across the product 100 so as to over-fill the remaining un-filled portions of the replacement gate cavities 111. At that point, a CMP process operation may be performed to remove portions of the layer of conductive material 140 positioned outside of the gate cavities 111 and above the upper surface of the layer of insulating material 114. Then, a recess etching process may be performed to remove some of the vertical thickness of the various materials within the gate cavities 111 (e.g., materials 140, 127, 124, 122, 116) so as to make room for the final gate cap 142 that will be formed above the recessed materials within the gate cavities 111. The amount of recessing of the materials within the gate cavities 111 may vary depending upon the particular application. At that point, a layer of final gate cap material (e.g., silicon nitride) may be deposited across the product 100 so as to over-fill the remaining portions of the replacement gate cavities 111 above the recessed materials within the gate cavities 111. Then, another CMP process operation may be performed to remove portions of the layer of final gate cap material positioned outside of the gate cavities 111 and above the upper surface of the layer of insulating material 114 so as to thereby form the final gate caps 142 between the spacer structures 112.

With reference to FIGS. 61-64, in one illustrative example, the device 104 may be representative of either an SLVT or an LVT PFET device, the device 106 may be representative of either an RVT or an HVT PFET device, the device 108 may be representative of an RVT or an HVT NFET device and the device 110 may be representative of an SLVT or an LVT NFET device.

Figure 65:
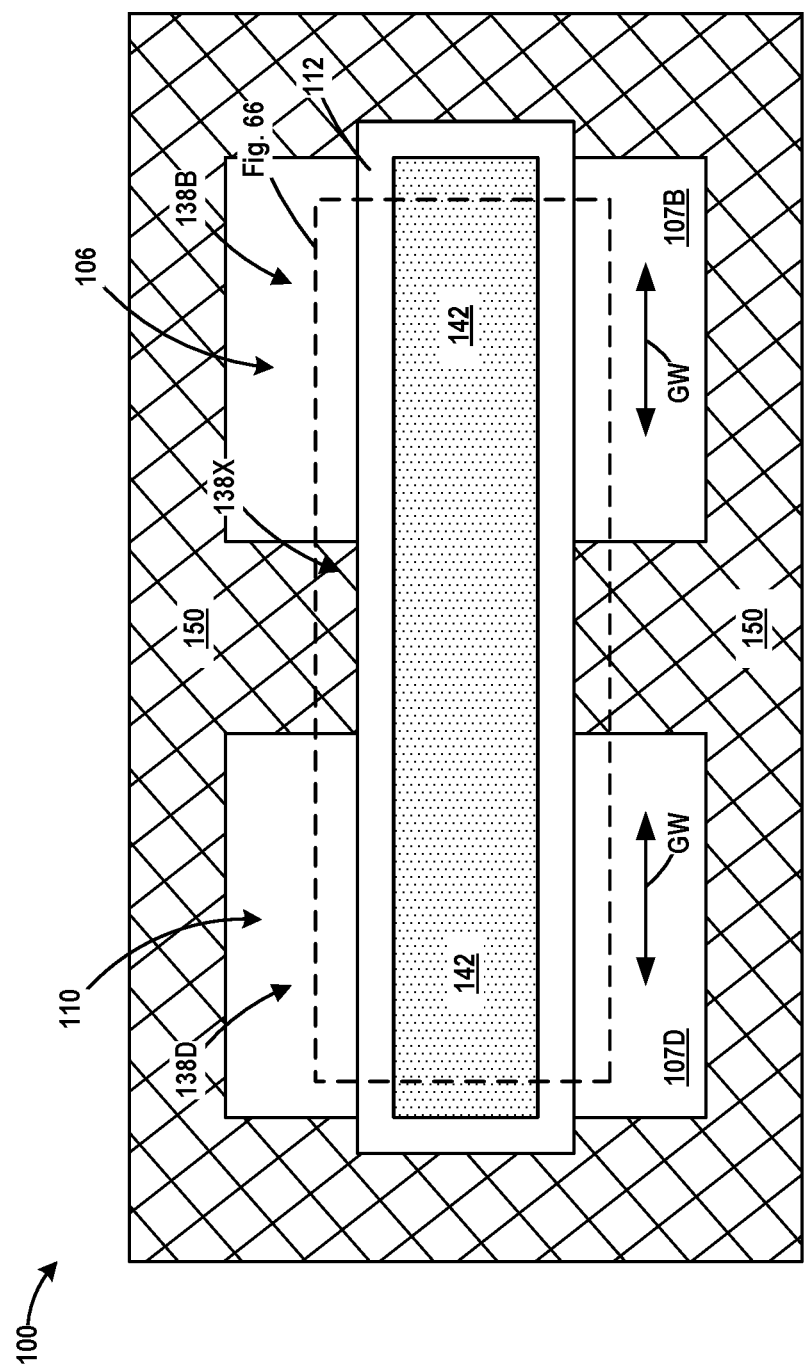
Figure 66:
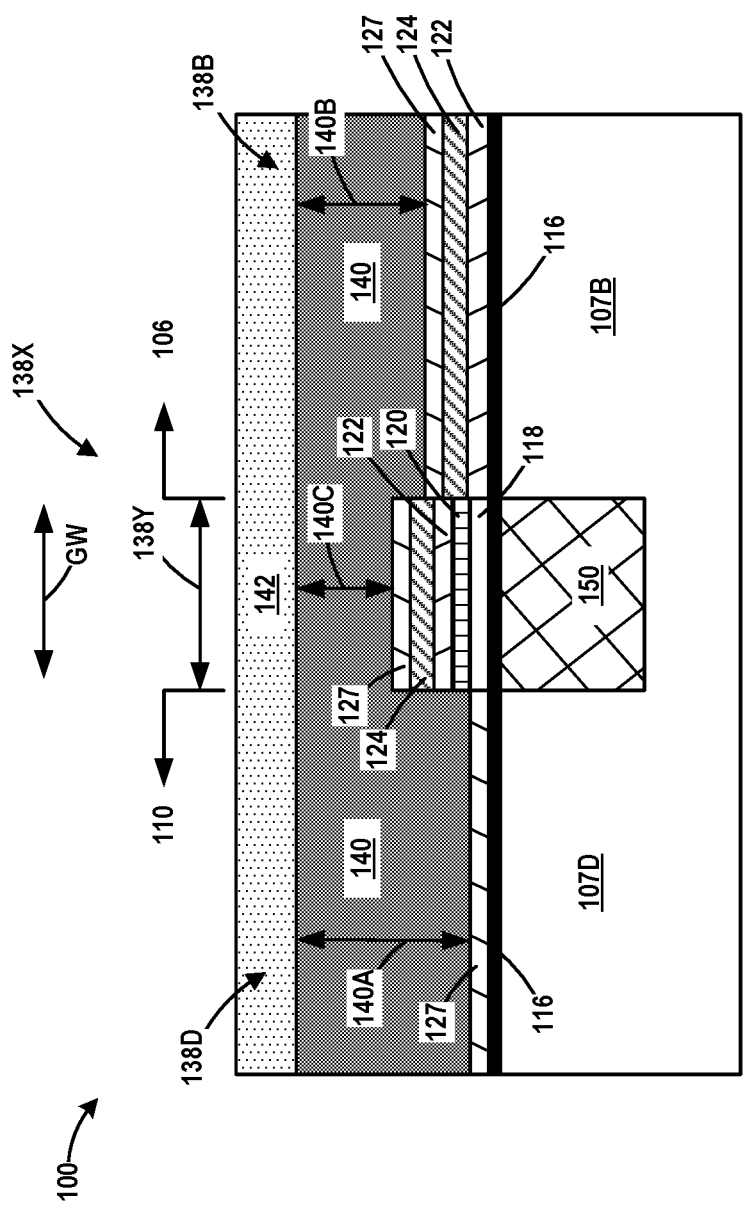

FIG. 65 (plan view) and FIG. 66 (cross-sectional view) depict another embodiment of an IC product 100 disclosed herein. In general, this embodiment of the IC product comprises two transistor devices that share a common gate structure 138X that extends above two active regions (e.g., 107B, 107D) and across isolation material 150 positioned between the two active regions 107B, 107D. Such a shared-gate arrangement may be employed in various applications in the semiconductor manufacturing industry, e.g., 6T SRAM cells, where an N-type pull-up transistor formed on a first active region shares a gate structure with a P-type pull-down transistor on a second active region. In this illustrative example, the common gate structure 138X will be shared by the transistor 110 (formed on the active region 107D) and the transistor 106 (formed on the active region 107B). The gate width (GW) direction of the transistors is depicted in FIG. 65. FIG. 66 is a cross-sectional view taken through a portion of the shared gate structure 138X in the gate-width direction of the devices and through the isolation material 150 separating the two active regions 107B, 107D.

In stating that the gate structure 138X is shared between the two devices 106, 110, it does not mean that the materials of construction of the shared gate structure are uniform throughout the axial length of the shared gate structure. Rather, using the methods disclosed herein, the portion of the shared gate structure 138X positioned above the active region 107D will have the gate structure 138D shown in FIG. 64, the portion of the shared gate structure 138X positioned above the active region 107B will have the gate structure 138B shown in FIG. 62 and the portion of the shared gate structure 138X positioned above the isolation material 150 between the active regions 107B, 107D will have yet another material stack configuration due to the masking and etching processes described above. That is, the materials of the gate structures for the transistor devices 106, 110 will still be tailored to achieve the desired difference in threshold voltage levels even though these gate structures 138D, 138B are conductively coupled to one another via the portion of the shared gate structure (with yet another different material stack combination) positioned between the two active regions 107B, 107D. Of course, as will be appreciated by those skilled in the art after a complete reading of the present application, the depiction of the transistors 110 and 106 is by way of example only and other combinations of the various transistor devices disclosed above could be equally used.

With reference to FIG. 66, the portion of the shared gate structure 138X positioned above the isolation material 150 between the two active regions 107B, 107D, i.e., the above-isolation portion 138Y of the shared gate structure 138X will comprise all of the conformal materials formed above, i.e., the conformal sacrificial material layer 118, the MCM layers 120, 122, 124 and 127 and the bulk conductive material 140. Thus, in this case, the remaining portion of the conformal sacrificial material layer 118 is not, in fact, sacrificial since it is in position above the conformal high-k insulating 116 in the above-isolation portion 138Y of the shared gate structure 138X. This is the result of the formation of the various patterned etch masks above, which, in this example, would always substantially cover the area substantially above the isolation material 150 positioned between the active regions 170B, 107D. However, no attempt has been made to show the continuity of any particular layer(s) of material that are common to the above-isolation portion 138Y of the shared gate structure 138X and either or both of the gate structures 138D, 138B. Rather, so as not to overly complicate FIG. 66, the various layers of material are simply shown as vertical stacks of material.

With continuing reference to FIG. 66, the device 110 comprises the conformal high-k gate insulation layer 116, the conformal MCM layer 127 and a relatively thicker portion 140A of the bulk conductive material 140. In contrast, the device 106 comprises the conformal high-k gate insulation layer 116, the conformal MCM layers 122, 124 and 127 and a relatively thinner portion 140B of the bulk conductive material 140 (due to the presence of more conformal layers of material in the gate structure 138B as compared to the gate structure 138D. As noted above, the above-isolation portion 138Y of the shared gate structure 138X comprises the conformal high-k gate insulation layer 116, the unique conformal layer 118, the conformal MCM layers 120, 122, 124 and 127 and the relatively thinnest portion 140C of the bulk conductive material 140. That is, while the gate structures 138B and 138D share at least one of the conformal MCM layers, e.g., the layer 127 in the depicted example, the above-isolation portion 138Y of the shared gate structure 138X comprises at least one unique conformal layer of material 118 that is not present in either of the gate structures 138B and 138D. Additionally, in accordance with one embodiment of an IC product disclosed herein, wherein two separate transistor devices share a gate structure, like the shared gate structure 138X, the number of conformal layers of material will be different in all three regions of the shared gate structure. More specifically, in the depicted example, the gate structure 138D of the transistor 110 comprises two conformal layers of material (116 and 127), the gate structure 138B of the transistor 106 comprises four conformal layers of material (116, 122, 124 and 127, and the portion 138Y of the gate structure 138X comprises six conformal layers of material (116, 118, 120, 122, 124 and 127). This configuration of different numbers of conformal layers of material in the three different regions of the shared gate structure 138X will be true irrespective of which two of the four above-described transistors (104, 106, 108 and 110) are formed on the isolated active regions.

Figure 67:
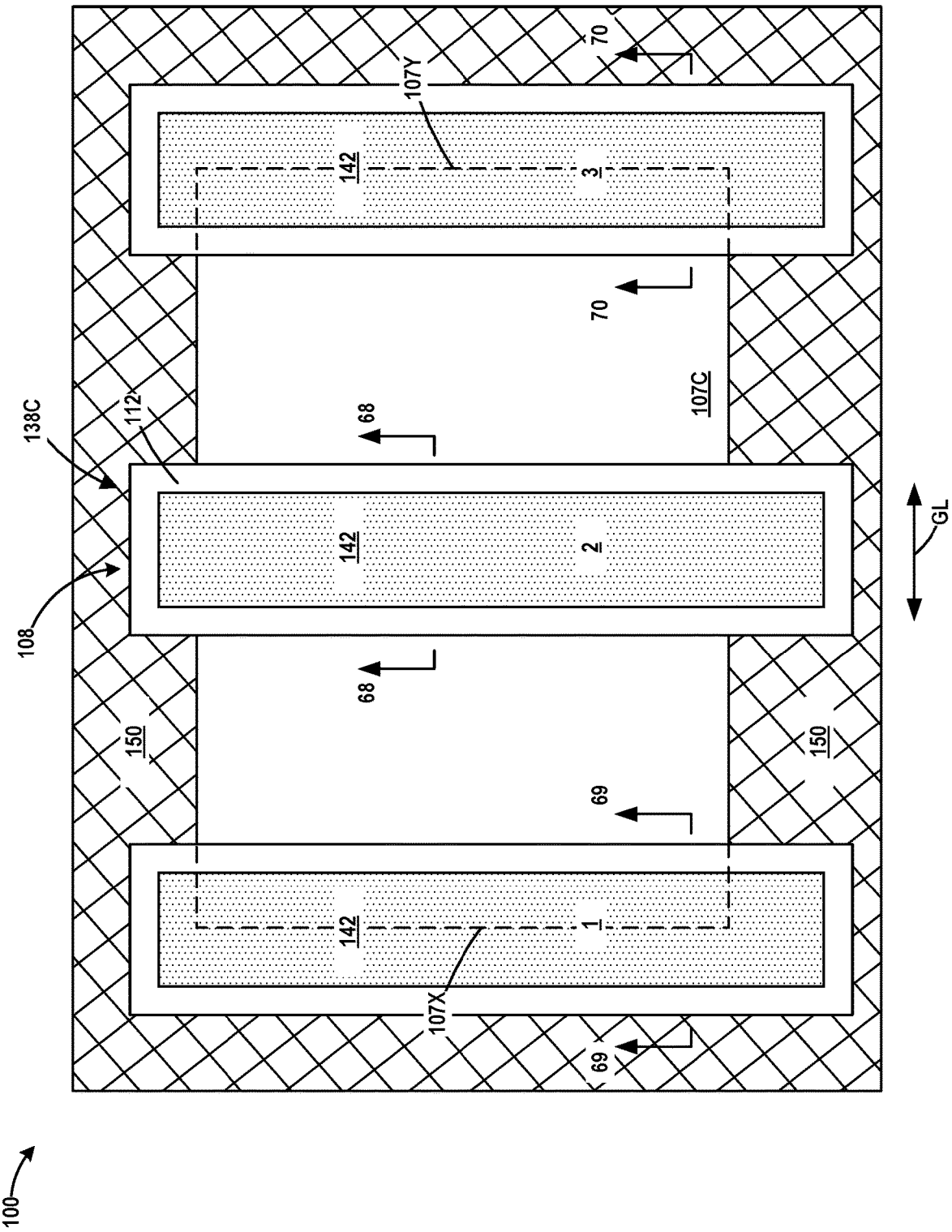

FIG. 67 (plan view) and FIGS. 68-70 (cross-sectional views) depict another embodiment of an IC product 100 disclosed herein depicting three gates (labeled 1-3 for reference purposes) formed above a single isolated active region 107C. Gate 2 corresponds to gate structure 138C for the illustrative device 108 disclosed above. Gates 1 and 3 are positioned above the opposing lateral edges 107X, 107Y, respectively, of the active region 107C. The gates 1 and 3 are "dummy gates" as it relates to the operation of the single active transistor—the device 108—shown in FIG. 67. Those skilled in the art will appreciate the two outermost gates 1 and 3 are sometimes referred to as "tucked" gates. Of course, as will be appreciated by those skilled in the art after a complete reading of the present application, the depiction of the transistor 108 is by way of example only as this discussion would apply equally to an IC product including any of the other transistor devices disclosed herein.

FIGS. 68, 69 and 70 are cross-sectional views of the gates 2, 1 and 3, respectively, that are taken through the gates in a direction corresponding to the gate length direction of the transistor 108. In this embodiment, since the gates 1 and 3 are dummy gates, the sacrificial material layer 118 will not be removed from the gate structures of these gates and thus become a part of the final gate structure for the gates 1 and 3. In one illustrative embodiment, the gate structures of gates 1 and 3 have the same stack of gate materials.

In the depicted example, the gate stack or gate structure 138C of the transistor 108 comprises the conformal high-k gate insulation layer 116, the conformal MCM layers 124 and 127 and the bulk conductive material 140. In contrast, gate structures of gates 1 and 3 comprise the conformal high-k gate insulation layer 116, the unique conformal layer 118, the conformal MCM layers 120, 122, 124 and 127 and the bulk conductive material 140. Stated another way, while the gate structure of gate 2 and the gate structures of gates 1 and 3 (considered collectively) have at least one of the conformal MCM layers that is made of the same material, e.g., the layers 124 and 127 in the depicted example, the gate structures of gates 1 and 3 comprises at least one unique conformal layer of material 118 that is not present in the gate structure 138C of gate 2. Stated another way, irrespective of which of the four types of transistors (104, 106, 108 or 110) is represented by gate 2, the number of conformal layers of material on the active gate structure (gate 2) will always be less than the number of conformal layers of material formed in the gate structures of the dummy gates (gates 1 and 3). Of course, as will be appreciated by those skilled in the art, in some arrangements, the active region may be large enough such that a plurality of active transistors are formed on the active region between the two outermost tucked gates 1 and 3.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. An integrated circuit product, comprising:
   first and second active regions formed in a semiconductor substrate;
   an isolation material positioned between the first and second active regions; and
   a shared gate structure on the semiconductor substrate, the shared gate structure comprising:
      a high-k gate insulation layer above a top surface of the first active region, a top surface of the second active region, and a top surface of the isolation material;
      a first set of metal containing material (MCM) layers on the high-k gate insulation layer above the first active region
      a second set of MCM layers on the high-k gate insulation layer above the second active region; and
      a unique layer of material having a bottom surface above a top surface of the high-k gate insulation layer, a first sidewall of the unique layer of material abutting the first set of MCM layers, and a second sidewall of the unique layer of material opposite the first sidewall of the unique layer of material abutting the second set of MCM layers, wherein the first and second sets of MCM layers are devoid of the unique layer of material.

2. The integrated circuit product of claim 1, wherein the first set of MCM layers of the shared gate structure comprises a first number of layers of MCM positioned above the high-k gate insulation layer and the second set of MCM layers of the shared gate structure comprises a second number of layers of MCM positioned above the high-k gate insulation layer and wherein the first number of layers of MCM in the first set of MCM layers of the shared gate structure is different than the second number of layers of MCM in the second set of MCM layers of the shared gate structure.

3. The integrated circuit product of claim 2, wherein the first set of MCM layers of the shared gate structure consists of one layer of metal-containing material positioned above the high-k gate insulation layer and the second set of MCM layers of the shared gate structure comprises at least two layers of metal-containing material positioned above the high-k gate insulation layer.

4. The integrated circuit product of claim 2, wherein the first set of MCM layers of the shared gate structure comprises at least two layers of metal-containing material positioned above the high-k gate insulation layer and the second set of MCM layers of the shared gate structure comprises at least three layers of metal-containing material positioned above the high-k gate insulation layer.

5. The integrated circuit product of claim 2, wherein the shared gate structure includes a third set of MCM positioned above the unique layer of material, wherein the third set of MCM layers of the shared gate structure is different than the first number and the second number of layers of MCM in each of the first and second sets of MCM layers of the shared gate structure, respectively.

6. The integrated circuit product of claim 5, wherein the unique layer of material as well as the first number, the second number, and the third number of layers of metal-containing material all comprise a same material.

7. The integrated circuit product of claim 5, wherein the first, second and third sets of MCM layers of the shared gate structure have at least one layer of metal-containing material in common.

8. The integrated circuit product of claim 2, wherein the semiconductor substrate has an upper surface and wherein the first number of layers of metal-containing material and the high-k gate insulation layer has a first combined vertical thickness above the upper surface of the semiconductor substrate and the second number of layers of metal-containing material and the high-k gate insulation layer has a second combined vertical thickness.

9. The integrated circuit product of claim 8, wherein the third set of MCM layers includes a third number of layers of metal-containing material positioned above the unique layer of material and wherein the third number of layers of metal-containing material, the unique layer of material and the high-k gate insulation layer has a third combined vertical thickness above the upper surface of the semiconductor substrate that is greater than either of the first combined vertical thickness or the second combined vertical thickness.

10. The integrated circuit product of claim 1, wherein the isolation material includes a first sidewall vertically aligned with the first sidewall of the unique layer of material, and a second opposing sidewall vertically aligned with the second sidewall of the unique layer of material.

11. An integrated circuit product, comprising:
   first and second isolated active regions formed in a semiconductor substrate;
   an isolation material positioned between the first and second active regions; and
   a shared gate structure, the shared gate structure including a first metal containing material (MCM) stack that is positioned above the first active region, a second MCM stack that is positioned above the second active region and a third MCM stack that is positioned above the isolation material between the first and second MCM stacks of the shared gate structure, wherein the first, second and third MCM stacks of the shared gate structure each comprise a high-k gate insulation layer above a top surface of the first active region, a top surface of the second active region, and a top surface of the isolation material, and wherein the first MCM stack comprises a first number of MCM layers on the high-k insulation layer, the second MCM stack comprises a second number of MCM layers on the high-k insulation layer and the third MCM stack comprises a third number of MCM layers on the high-k insulation layer, wherein the first number, the second number and the third number are different from one another, wherein the third MCM stack comprises a unique layer of material having a bottom surface above a top surface of high-k gate insulation layer, a first sidewall of the unique layer of material abutting the first set of MCM layers, and a second sidewall of the unique layer of material opposite the first sidewall of the unique layer of material abutting the second set of MCM layers, and wherein the first and second MCM stacks of the shared gate structure are devoid of the unique layer of material.

12. The integrated circuit product of claim 11, wherein the third number is greater than either the first number or the second number.

13. The integrated circuit product of claim 11, wherein the semiconductor substrate has an upper surface and wherein the first number of MCM layers and the high-k gate insulation layer of the first MCM stack of the shared gate structure has a first combined vertical thickness above the upper surface of the semiconductor substrate and the second number of the MCM layers and the high-k gate insulation layer of the second MCM stack of the shared gate structure has a second combined vertical thickness, wherein the first combined vertical thickness and the second combined vertical thickness are different.

14. The integrated circuit product of claim 13, wherein the third number of MCM layers and the high-k gate insulation layer of the third MCM stack of the shared gate structure has a third combined vertical thickness above the upper surface of the semiconductor substrate that is greater than either of the first combined vertical thickness or the second combined vertical thickness.

15. The integrated circuit product of claim 11, wherein the first, second and third MCM stacks of the shared gate structure have at least one layer of metal-containing material in common.

16. An integrated circuit product, comprising:
first and second active regions formed in a semiconductor substrate;
an isolation material positioned between the first and second active regions; and
a shared gate structure on the semiconductor substrate, the shared gate structure comprising:
a first metal containing material (MCM) stack positioned above the first active region, the first MCM stack including:
a high-k gate insulation layer;
a first plurality of MCM layers on the high-k gate insulation layer above the first active region;
a second MCM stack positioned above the second active region, the second MCM stack including:
the high-k gate insulation layer;
a second plurality of MCM layers;
a third MCM stack positioned above the isolation material between the first and second MCM stacks, the third MCM stack including:
the high-k gate insulation layer;
a unique layer of material having a bottom surface above a top surface of the high-k gate insulation layer, a first sidewall of the unique layer of material abutting the first plurality of MCM layers, and a second sidewall of the unique layer of material opposite the first sidewall of the unique layer of material abutting the second plurality of MCM layers, wherein the first and second MCM stacks of the shared gate structure are devoid of the unique layer of material; and
a third plurality of MCM layers positioned above the unique layer of material.

17. The integrated circuit product of claim 16, wherein the first plurality of MCM layers in the first MCM stack of the shared gate structure is different than the second plurality of MCM layers in the second MCM stack of the shared gate structure.

18. The integrated circuit product of claim 16, wherein the third plurality is greater than either the first plurality or the second plurality.

19. The integrated circuit product of claim 16, wherein the semiconductor substrate has an upper surface and wherein the first plurality of MCM layers and the high-k gate insulation layer of the first MCM stack of the shared gate structure has a first combined vertical thickness above the upper surface of the semiconductor substrate and the second plurality of MCM layers and the high-k gate insulation layer of the second MCM stack of the shared gate structure has a second combined vertical thickness, wherein the first combined vertical thickness and the second combined vertical thickness are different.

20. The integrated circuit product of claim 19, wherein the third plurality of MCM layers and the high-k gate insulation layer of the third MCM stack of the shared gate structure has a third combined vertical thickness above the upper surface of the semiconductor substrate that is greater than either of the first combined vertical thickness or the second combined vertical thickness.

* * * * *